(12) United States Patent
Makhota et al.

(10) Patent No.: US 10,063,056 B2
(45) Date of Patent: *Aug. 28, 2018

(54) SYSTEMS AND METHODS FOR REMOTE OR LOCAL SHUT-OFF OF A PHOTOVOLTAIC SYSTEM

(71) Applicant: Tigo Energy, Inc., Los Gatos, CA (US)

(72) Inventors: Maxym Makhota, Cupertino, CA (US); Daniel Eizips, Sunnyvale, CA (US); Dan Kikinis, Los Altos, CA (US)

(73) Assignee: TIGO ENERGY, INC., Los Gatos, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/186,330

(22) Filed: Jun. 17, 2016

(65) Prior Publication Data

US 2016/0301214 A1    Oct. 13, 2016

Related U.S. Application Data

(63) Continuation of application No. 14/503,723, filed on Oct. 1, 2014, now Pat. No. 9,377,765, which is a
(Continued)

(51) Int. Cl.
*G05B 9/02* (2006.01)
*H01L 31/02* (2006.01)
(Continued)

(52) U.S. Cl.
CPC ................ *H02J 3/383* (2013.01); *G05B 9/02* (2013.01); *H01L 31/02021* (2013.01);
(Continued)

(58) Field of Classification Search
CPC ....... G05B 23/02; H01L 31/042; G01R 31/26; G08B 13/00
(Continued)

(56) References Cited

U.S. PATENT DOCUMENTS 5,143,556 A   9/1992 Matlin
5,235,266 A   8/1993 Schaffrin
(Continued)

FOREIGN PATENT DOCUMENTS

AU    2005262278    7/2005
DE       4232356    3/1994
(Continued)

OTHER PUBLICATIONS

Alonso, R. et al., "A New Distributed Converter Interface for PV Panels," 20th European Photovoltaic Solar Energy Conference, Barcelona, Spain, pp. 2288-2291, Jun. 6-10, 2005.
(Continued)

*Primary Examiner* — Omar Casillashernandez
(74) *Attorney, Agent, or Firm* — Greenberg Traurig, LLP

(57) ABSTRACT

Systems and methods for shut-down of a photovoltaic system. In one embodiment, a method implemented in a computer system includes: communicating, via a central controller, with a plurality of local management units (LMUs), each of the LMUs coupled to control a respective solar module; receiving, via the central controller, a shut-down signal from a user device (e.g., a hand-held device, a computer, or a wireless switch unit); and in response to receiving the shut-down signal, shutting down operation of the respective solar module for each of the LMUs.

17 Claims, 13 Drawing Sheets

Related U.S. Application Data continuation of application No. 13/073,915, filed on Mar. 28, 2011, now Pat. No. 8,854,193, which is a continuation-in-part of application No. 12/895,745, filed on Sep. 30, 2010, now Pat. No. 8,773,236.

(60) Provisional application No. 61/335,004, filed on Dec. 29, 2009.

(51) Int. Cl.
| | |
|---|---|
| *H02J 1/00* | (2006.01) |
| *H02J 3/38* | (2006.01) |
| *H02S 40/30* | (2014.01) |
| *H02M 7/44* | (2006.01) |
| *G06F 11/07* | (2006.01) |

(52) U.S. Cl.
CPC .............. *H02J 1/00* (2013.01); *H02M 7/44* (2013.01); *H02S 40/30* (2014.12); *G06F 11/0736* (2013.01); *G06F 11/0757* (2013.01); *G06F 11/0793* (2013.01); *Y02E 10/50* (2013.01); *Y10T 307/76* (2015.04)

(58) Field of Classification Search
USPC ...................................................... 340/12.27
See application file for complete search history.

(56) References Cited

U.S. PATENT DOCUMENTS

| | | |
|---|---|---|
| 5,268,832 A | 12/1993 | Kandatsu |
| 5,280,133 A | 1/1994 | Nath |
| 5,472,614 A | 12/1995 | Rossi |
| 5,604,430 A | 2/1997 | Decker et al. |
| 5,923,158 A | 7/1999 | Kurokami et al. |
| 6,031,736 A | 2/2000 | Takehara et al. |
| 6,093,885 A | 7/2000 | Takehara et al. |
| 6,101,073 A | 8/2000 | Takehara |
| 6,275,016 B1 | 8/2001 | Ivanov |
| 6,350,944 B1 | 2/2002 | Sherif et al. |
| 6,396,239 B1 | 5/2002 | Benn et al. |
| 6,448,489 B2 | 9/2002 | Kimura et al. |
| 6,515,215 B1 | 2/2003 | Mimura |
| 6,545,211 B1 | 4/2003 | Mimura |
| 6,593,520 B2 | 7/2003 | Kondo et al. |
| 6,650,031 B1 | 11/2003 | Goldack |
| 6,653,549 B2 | 11/2003 | Matsushita et al. |
| 6,763,226 B1 | 7/2004 | McZeal, Jr. |
| 6,837,739 B2 | 1/2005 | Gorringe et al. |
| 6,844,739 B2 | 1/2005 | Kasai et al. |
| 6,894,911 B2 | 5/2005 | Telefus et al. |
| 6,897,370 B2 | 5/2005 | Kondo et al. |
| 6,984,970 B2 | 1/2006 | Capel |
| 7,061,214 B2 | 6/2006 | Mayega et al. |
| 7,150,938 B2 | 12/2006 | Munshi et al. |
| 7,248,946 B2 | 7/2007 | Bashaw et al. |
| 7,256,566 B2 | 8/2007 | Bhavaraju et al. |
| 7,276,886 B2 | 10/2007 | Kinder et al. |
| 7,516,106 B2 | 4/2009 | Ehlers et al. |
| 7,518,346 B2 | 4/2009 | Prexl et al. |
| 7,595,616 B2 | 9/2009 | Prexl et al. |
| 7,605,498 B2 | 10/2009 | Ledenev et al. |
| 7,719,140 B2 | 5/2010 | Ledenev et al. |
| 7,807,919 B2 | 10/2010 | Powell et al. |
| 7,884,278 B2 | 2/2011 | Powell et al. |
| 8,013,472 B2 | 9/2011 | Adest et al. |
| 8,035,249 B2 | 10/2011 | Shaver, II et al. |
| 8,212,139 B2 | 7/2012 | Meyer |
| 8,427,009 B2 | 4/2013 | Shaver, II et al. |
| 8,531,055 B2 | 9/2013 | Adest et al. |
| 8,563,847 B2 | 10/2013 | Meyer et al. |
| 8,587,151 B2 | 11/2013 | Adest et al. |
| 8,669,675 B2 | 3/2014 | Capp et al. |
| 8,816,535 B2 | 8/2014 | Adest et al. |
| 8,823,218 B2 | 9/2014 | Hadar et al. |
| 8,828,778 B2 | 9/2014 | Meyer |
| 8,854,193 B2 | 10/2014 | Makhota et al. |
| 8,933,320 B2 | 1/2015 | Meyer |
| 8,947,194 B2 | 2/2015 | Sella et al. |
| 9,112,379 B2 | 8/2015 | Sella et al. |
| 9,377,765 B2 | 6/2016 | Makhota et al. |
| 9,401,599 B2 | 7/2016 | Har-Shai et al. |
| 9,438,035 B2 | 9/2016 | Capp et al. |
| 9,543,890 B2 | 1/2017 | Meyer et al. |
| 9,590,526 B2 | 3/2017 | Adest et al. |
| 9,768,725 B2 | 9/2017 | Meyer |
| 2004/0056768 A1 | 3/2004 | Matsushita et al. |
| 2005/0057214 A1 | 3/2005 | Matan |
| 2005/0057215 A1 | 3/2005 | Matan |
| 2006/0001406 A1 | 1/2006 | Matan |
| 2006/0174939 A1 | 8/2006 | Matan |
| 2006/0185727 A1 | 8/2006 | Matan |
| 2006/0231132 A1 | 10/2006 | Neussner |
| 2007/0019613 A1 | 1/2007 | Frezzolini |
| 2007/0229237 A1 | 10/2007 | Kates |
| 2007/0273351 A1 | 11/2007 | Matan |
| 2008/0121272 A1 | 5/2008 | Besser et al. |
| 2008/0122449 A1 | 5/2008 | Besser et al. |
| 2008/0122518 A1 | 5/2008 | Besser et al. |
| 2008/0142071 A1 | 6/2008 | Dorn et al. |
| 2008/0147335 A1 | 6/2008 | Adest et al. |
| 2008/0164766 A1 | 7/2008 | Adest et al. |
| 2008/0179949 A1 | 7/2008 | Besser et al. |
| 2008/0191560 A1 | 8/2008 | Besser et al. |
| 2008/0191675 A1 | 8/2008 | Besser et al. |
| 2008/0236648 A1 | 10/2008 | Klein et al. |
| 2008/0303503 A1 | 12/2008 | Wolfs |
| 2009/0066357 A1 | 3/2009 | Fornage |
| 2009/0114263 A1 | 5/2009 | Powell et al. |
| 2009/0133736 A1 | 5/2009 | Powell et al. |
| 2009/0179662 A1 | 7/2009 | Moulton et al. |
| 2009/0182532 A1 | 7/2009 | Stoeber et al. |
| 2009/0183760 A1 | 7/2009 | Meyer |
| 2009/0207543 A1 | 8/2009 | Boniface et al. |
| 2009/0242011 A1 | 10/2009 | Proisy et al. |
| 2010/0057267 A1 | 3/2010 | Liu et al. |
| 2010/0131108 A1 | 5/2010 | Meyer |
| 2010/0132758 A1* | 6/2010 | Gilmore ............ H01L 31/02021 |
| | | 136/244 |
| 2010/0139734 A1 | 6/2010 | Hadar et al. |
| 2010/0282293 A1 | 11/2010 | Meyer et al. |
| 2010/0321148 A1 | 12/2010 | Gevorkian |
| 2010/0326809 A1 | 12/2010 | Lang et al. |
| 2011/0061713 A1 | 3/2011 | Powell et al. |
| 2011/0068702 A1* | 3/2011 | van de Ven .......... H05B 33/083 |
| | | 315/186 |
| 2011/0172842 A1 | 7/2011 | Makhota et al. |
| 2011/0218687 A1 | 9/2011 | Hadar et al. |
| 2012/0234374 A1 | 9/2012 | Meyer |
| 2014/0035373 A1 | 2/2014 | Meyer et al. |
| 2015/0028692 A1 | 1/2015 | Makhota et al. |
| 2015/0047689 A1 | 2/2015 | Meyer |
| 2017/0085094 A1 | 3/2017 | Meyer et al. |

FOREIGN PATENT DOCUMENTS

| | | |
|---|---|---|
| DE | 19961705 | 7/2001 |
| DE | 102005012213 | 1/2009 |
| DE | 102005018173 | 5/2009 |
| EP | 1388774 | 2/2004 |
| ES | 2249147 | 3/2006 |
| JP | 4219982 | 8/1992 |
| JP | 8097460 | 4/1996 |
| JP | 8116628 | 5/1996 |
| JP | 8316517 | 11/1996 |
| JP | 9148611 | 6/1997 |
| JP | 11103538 | 4/1999 |
| JP | 2000358330 | 12/2000 |
| JP | 2003134661 | 5/2003 |
| KR | 200402282 | 11/2005 |
| KR | 100725755 | 6/2007 |
| KR | 100912892 | 8/2009 |

(56) References Cited

FOREIGN PATENT DOCUMENTS

| TK | 2003012569 | 2/2003 |
|----|------------|--------|
| WO | 2010037393 | 4/2010 |

OTHER PUBLICATIONS

Alonso, R. et al., "Experimental Results of Intelligent PV Module for Grid-Connected PV Systems," 21st European Photovoltaic Solar Energy Conference, Dresden, Germany, pp. 2297-2300, Sep. 4-8, 2006.

Advanced Energy Group, "The Basics of Solar Power Systems," located at http://web.archive.org/web/20010331044156/http://www.solar4power.com/solar-power-basics.html, Mar. 31, 2001.

Basso, Tim, "IEEE Standard for Interconnecting Distributed Resources With the Electric Power System," IEEE PES Meeting, Jun. 9, 2004.

Boostbuck.com, "The Four Boostbuck Topologies," located at http://www.boostbuck.com/TheFourTopologies.html, 2003.

Definition of "removable" from Webster's Third New International Dictionary, Unabridged, 1993.

Definition of "remove" from Webster's Third New International Dictionary, Unabridged, 1993.

Enslin, Johan H.R., et al., "Integrated Photovoltaic Maximum Power Point Tracking Converter," IEEE Transactions on Industrial Electronics, vol. 44, No. 6, pp. 769-773, Dec. 1997.

Gautam, Nalin K. et al., "An Efficient Algorithm to Simulate the Electrical Performance of Solar Photovoltaic Arrays," Energy, vol. 27, No. 4, pp. 347-361, 2002.

Hewes, J. "Relays," located at http://web.archive.org/web/20030816010159/www.kpsec.freeuk.com/components/relay.htm, Aug. 16, 2003.

International Patent Application No. PCT/US2008/081827, International Search Report and Written Opinion, dated Jun. 24, 2009.

International Patent Application No. PCT/US2010/046274, International Search Report and Written Opinion, dated Apr. 22, 2011.

International Patent Application No. PCT/US2011/033658, International Search Report and Written Opinion, dated Jan. 13, 2012.

Linares, Leonor et al., "Improved Energy Capture in Series String Photovoltaics via Smart Distributed Power Electronics," 24th Annual IEEE Applied Power Electronics Conference and Exposition, pp. 904-910, Feb. 15, 2009.

Nordmann, T. et al., "Performance of PV Systems Under Real Conditions," European Workshop on Life Cycle Analysis and Recycling of Solar Modules, The "Waste" Challenge, Brussels, Belgium, Mar. 18-19, 2004.

Palma, L. et al., "A Modular Fuel Cell, Modular DC-DC Converter Concept for High Performance and Enhanced Reliability," 38th IEEE Power Electronics Specialists Conference (PESC'07), pp. 2633-2638, Jun. 17, 2007.

Quaschning, V. et al., "Cost Effectiveness of Shadow Tolerant Photovoltaic Systems," Euronsun 96, pp. 819-824, Sep. 16, 1996.

Roman, Eduardo, et al., "Intelligent PV Module for Grid-Connected PV Systems," IEEE Transactions on Industrial Electronics, vol. 53, No. 4, pp. 1066-1073, Aug. 2006.

Uriarte, S. et al., "Energy Integrated Management System for PV Applications," 20th European Photovoltaic Solar Energy Conference, Jun. 6, 2005.

Walker, G. R. et al., "Cascaded DC-DC Converter Connection of Photovoltaic Modules," 33rd IEEE Power Electronics Specialists Conference (PESC'02), vol. 1, pp. 24-29, 2002.

Walker, Geoffrey R. et al., "Cascaded DC-DC Converter Connection of Photovoltaic Modules," IEEE Transactions on Power Electronics, vol. 19, No. 4, pp. 1130-1139, Jul. 2004.

Wiles, John, "Photovoltaic Power Systems and the National Electrical Code: Suggested Practices," Sandia National Laboratories, document No. SAND2001-0674, Mar. 2001.

Title: Apparatuses and Methods to Reduce Safety Risks Associated with Photovoltaic Systems, U.S. Appl. No. 12/948,614, filed Nov. 17, 2010, Inventor: Earl Powell, et al, Status: Non Final Action dated May 31, 2017.

Title: Systems and Methods for Remote or Local Shut-off of a Photovoltaic System, U.S. Appl. No. 13/073,915, filed Mar. 28, 2011, Inventor: Maxym Makhota, et al, U.S. Pat. No. 8,854,193, Issue Date: Oct. 7, 2014.

Title: Systems and Methods for Remote or Local Shut-off of a Photovoltaic System, U.S. Appl. No. 15/503,723, filed Oct. 1, 2014, Inventor: Maxym Makhota, et al, U.S. Pat. No. 9,377,765, Issue Date: Jun. 28, 2016.

Title: Systems and Methods for an Enhanced Watchdog in Solar Module Installations, U.S. Appl. No. 14/572,458, filed Dec. 16, 2014, Status: Non Final Action dated Sep. 5, 2017.

Title: Systems and Method for Enhanced Watch Dog in Solar Panel Installations, U.S. Appl. No. 15/717,244, filed Sep. 27, 2017, Status: Docketed New Case—Ready for Examination, Status Date: Feb. 12, 2018.

* cited by examiner

SYSTEMS AND METHODS FOR REMOTE OR LOCAL SHUT-OFF OF A PHOTOVOLTAIC SYSTEM

RELATED APPLICATIONS

The present application is a continuation application of U.S. Pat. App. Ser. No. 14/503,723, filed Oct. 1, 2014, issued as U.S. Pat. No. 9,377,765 on Jun. 28,2016, and entitled "Systems and Methods for Remote or Local Shut-Off of a Photovoltaic System,"which is a continuation application of U.S. Pat. App. Ser. No. 13/073,915, filed Mar. 28, 2011, issued as U.S. Pat. No. 8,854,193 on Oct. 7, 2014, and entitled "Systems and Methods for Remote or Local Shut-Off of a Photovoltaic System," which is a continuation in part application of U.S. Pat. App. Ser. No. 12/895,745, filed Sep. 30, 2010, issued as U.S. Pat. No. 8,773,236 on Jul. 8, 2014 and entitled "Systems and Methods for a Communication Protocol between a Local Controller and a Master Controller," which claims priority to Prov. U.S. Pat. App. Ser. No. 61/335,004, filed Dec. 29, 2009 and entitled "system and Method for an Enhanced Protocol between a local Controller and a Master Controller," the entire contents of which applications are hereby incorporated by reference as if fully set forth herein.

The present application is related to: U.S. Pat. No. 7,884,278, issued Feb. 8, 2011 and entitled "Apparatuses and Methods to Reduce Safety Risks Associated with Photovoltaic Systems", which has a continuation application issued as U.S. Pat. No. 7,807,919 on Oct. 5, 2010, and a continuation application published as U.S. Pat. App. Pub. No. 2011/0061713 on Mar. 17, 2011; U.S. Pat. No. 8,823,218, issued Sep. 2, 2014 and entitled "System and Method for Enhanced Watch Dog in Solar Panel Installations", which has a continuation application Ser. No. 14/473,659, filed on Aug. 29, 2014; U.S. Pat. No. 7,602,080, issued Oct. 13, 2009 and entitled "Systems and Methods to Balance Solar Panels in a Multi-Panel System"; and U.S. Pat. App. Pub. No. 2010/0139734, published Jun. 10, 2010 and entitled "Systems and Methods for an Enhanced Watchdog in Solar Module Installations," the entire contents of which applications are hereby incorporated by reference as if fully set forth herein.

FIELD OF THE TECHNOLOGY

At least some embodiments disclosed herein relate to photovoltaic systems in general, and more particularly, but not limited to, the remote or local shut-off of a photovoltaic system.

BACKGROUND

When a photovoltaic panel or laminate is exposed to direct or diffuse light, a lethal voltage potential may be present. In the United States the possible voltage could be as high as 600 volts, while in Europe and the rest of the world this voltage could approach a kilovolt.

Because of the potential danger from electrical shock, solar system installers take a large guard band (or safety margin) to make sure the voltages don't cross the 600V or 1000V limits in the United States and the European Union, respectively. That limitation inhibits them from installing more solar panel modules, often referred to as "modules" or "panels," in series to reduce the cost of combiner boxes or string inverters. When solar modules are connected in series or in mesh configurations, there can be a problem in which weaker modules not only produce less energy, but also affect other modules' capabilities to deliver energy in the same string or wiring section.

Also, potential danger from these high voltages may exist in various types of situations. For example, first responders, solar array installers, and maintenance personnel operating near solar arrays can be exposed to dangerous or lethal voltages. The danger can be even higher if certain wires are disconnected through theft, vandalism, accident, natural forces, or other causes. To protect first responders, solar array installers, and maintenance personnel, solar arrays can be turned off in an emergency. However, the systems used to turn off a solar array in an emergency may sometimes be damaged or disabled by the emergency (e.g., fire).

SUMMARY OF THE DESCRIPTION

Systems and methods for remote or local shut-off of a photovoltaic system are described herein. Some embodiments are summarized in this section.

In one embodiment, a method implemented in a data processing system includes: communicating, via a central controller, with a plurality of local management units (LMUs), each of the LMUs coupled to control a respective solar module; receiving, via the central controller, a shut-down signal from a user device (e.g., a hand-held device, a computer, or a wireless switch unit); and in response to receiving the shut-down signal, shutting down operation of the respective solar module for each of the LMUs.

The disclosure includes methods and apparatuses which perform these methods, including data processing systems which perform these methods, and computer readable media containing instructions which when executed on data processing systems cause the systems to perform these methods.

Other features will be apparent from the accompanying drawings and from the detailed description which follows.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
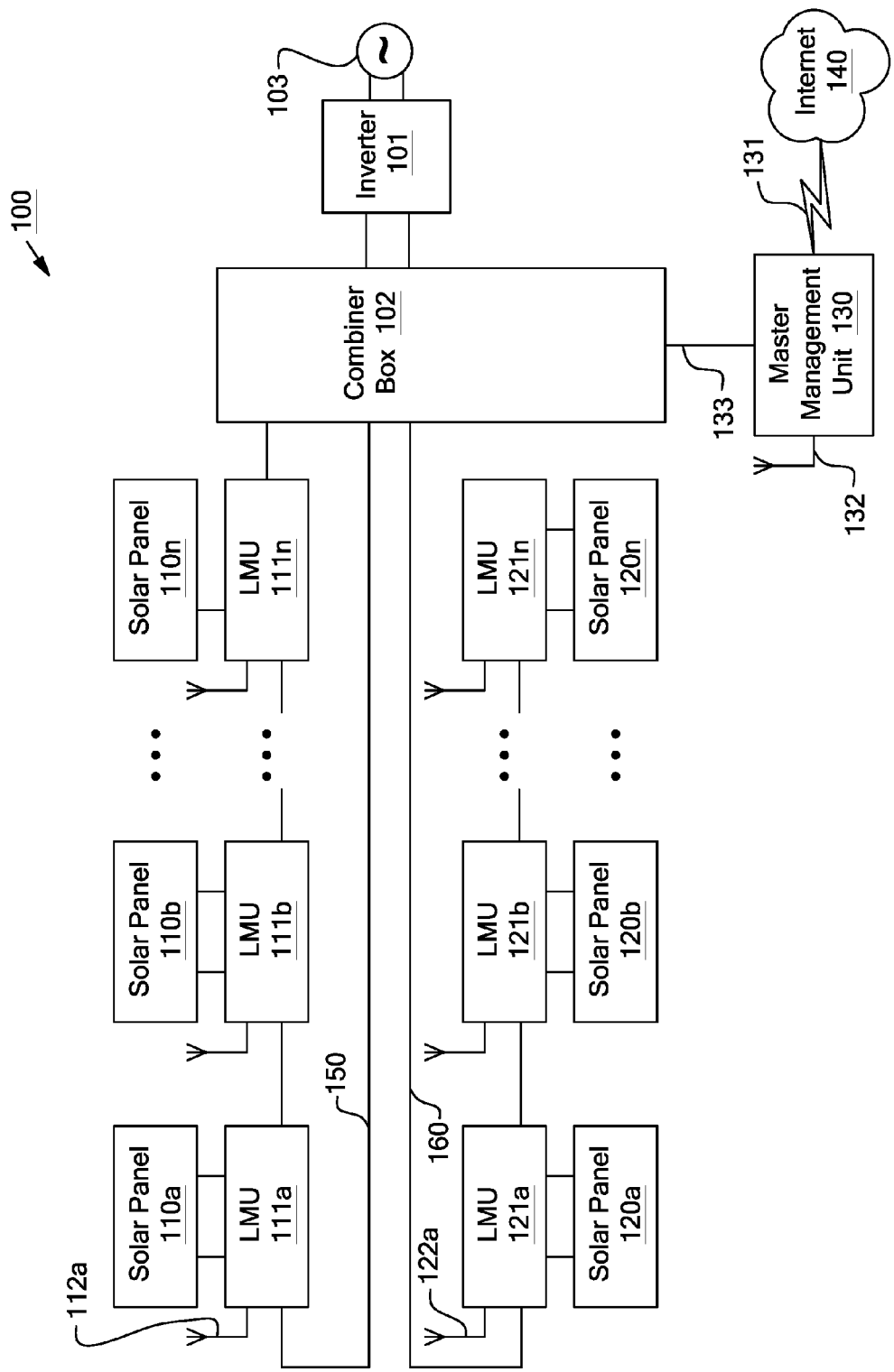
FIG. 1 shows an overview of a photovoltaic energy system including local management units (LMUs) according to one embodiment.

The following description and drawings are illustrative and are not to be construed as limiting. Numerous specific details are described to provide a thorough understanding. However, in certain instances, well known or conventional details are not described in order to avoid obscuring the description. References to one or an embodiment in the present disclosure are not necessarily references to the same embodiment; and, such references mean at least one.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

As used herein, a "solar cell" is a photovoltaic device configured to absorb photons and convert them into electrical energy. A "solar module" is a device that includes at least one or more solar cells, wherein the solar cells are connected in series or in parallel. A solar panel is one example of a solar module. The solar cells absorb photons and convert the photons into electrical energy. A power bus may be a conductive path connecting one or more solar modules in series.

At least some embodiments of the disclosure provide a system and method for the operation of distributed local management units (LMUs) in a photovoltaic energy system. The operation of one or more local management units in a photovoltaic energy system may be defined by a protocol. In particular, the protocol is typically able to recover from various kinds of errors. For example, the protocol may be self-adjusting in the case of errors and other operational problems that may arise. Also, the protocol may maintain certain safety aspects associated with the operation of the photovoltaic energy system (e.g., a maximum operating voltage and other desired parameters).

In one embodiment, each LMU attempts to communicate on a first active channel with a master management unit. Each LMU is coupled to control one solar module of a plurality of solar modules in the system. If the communication with the master management unit on the first active channel has been established, then the LMU proceeds to a configuration process. If the communication on the first active channel is not established (i.e., fails for some reason), the LMU attempts to communicate on a second active channel.

In one embodiment, the second active channel has a frequency different from the first active channel. If communication with the master management unit on the second active channel is established, then the LMU proceeds to the configuration process. If communication is not established after a predetermined total number of attempts or attempts on a predetermined number of channels, then the LMU proceeds to an error handling process.

FIG. 1 shows an overview of an exemplary system 100 according to one embodiment. System 100 contains two exemplary strings of solar panels, namely string 110*a-n* and string 120*a-n*. Each solar panel in each string has its own local management unit (e.g., a local controller or a data processing system), which, in this exemplary illustration, are units 111*a-n* and 121*a-n*, respective to the strings named above. The LMUs in FIG. 1 are connected in series (i.e., in a serial configuration) to power busses 150 and 160.

Each local management unit (LMU) has an antenna; in this exemplary illustration, only antennas 112*a* and 122*a* are numbered in FIG. 1, for simplicity and clarity of illustration. Combiner box 102 is typically used to combine the output of said multiple strings (i.e., 110*a-n* and 120*a-n*) of panels. Power busses 150 and 160 are connected to combiner box 102. For example, combiner box 102 may be used to house the wires, connections, etc., to combine the electricity generated from different solar panels, strings, subsystems, etc. Combiner box 102 is coupled to an inverter 101, for example, connected to power grid 103.

Master management unit (MMU) 130 (e.g., a master controller) is coupled to control each of the LMUs (e.g., by wireless communication via antennas 112*a* and 122*a*. MMU 130 acts as a gateway, connecting, for example, to the Internet 140, via connection 131, which may be wired, land line, Ethernet, wireless, or any other of various types of suitable connection. MMU 130 may store configuration profiles in a local database. MMU 130 may be updated or operated remotely from a remote server. For example, new profiles may be downloaded to MMU 130 using Internet 140.

In this example, MMU 130 has an antenna 132, which is used to communicate with the distributed LMUs. In some embodiments, one of the LMUs may act as the MMU for the system. The master management unit 130 is typically powered by the solar panels. However, it may be powered by alternative power sources, such as power grid 103.

Power line 133 may supply power to MMU 130, and in some cases, it could also transmit communications via power line communication between the MMU and LMUs, instead of using wireless communication. However, power line communication may exhibit problems similar to wireless communication, such as radio frequency (RF) interferences and other effects that may benefit from the use of active channel selection as described below. One example of power line communication is discussed in U.S. Pat. No. 8,653,689, issued Feb. 18, 2014 and entitled "Method and System for Current-Mode Power Line Communications," the entire contents of which is incorporated by reference as if fully set forth herein.

The structure as shown in FIG. 1 is one specific type of configuration, but other configurations may be used in other embodiments. For example, other system configurations may be as follows: 1) a set of solar panels, each connected to a parallel bus via a local management unit; 2) similarly as in FIG. 1, but with each string further connected to a parallel bus via a string management unit. In general, the operating protocol for the LMUs as described herein may be used with either a serial configuration (i.e., strings of local management units) or a parallel configuration (i.e., local management units on a parallel bus).

In one embodiment, an LMU may be provided for each solar panel, so that when the solar panels are connected into a system via the LMUs, the efficiency of the system as a whole is increased. In this embodiment, the LMUs are designed to keep each solar panel working at, or close to, its respective maximum power point, substantially independently from each other, even through the panels are connected together to form a system.

In addition to the efficiency consideration, the LMUs may also be configured to provide various features, such as safety, panel protection, etc., in various implementations. There are two possible types of LMUs that may be adapted for different types of basic connection configurations for solar panels: parallel and series. In a combination, strings of LMUs connected in serial may be each connected to a string management unit for parallel combinations of strings at a combiner box.

At a given working condition (e.g., sunlight exposure, temperature, etc.), the power output level of a solar panel is based on the voltage or current consumed by its load. At the given working condition, there is a maximum power point at which the solar panel outputs maximum power Wmp, at current Imp and voltage Vmp. If the working voltage deviates from Vmp (or the current from Imp), the power from the solar panel will be reduced.

In this embodiment, the LMUs permit individual solar panels to work at their maximum power points, while adjusting LMU outputs for efficient operations in serial or parallel connections. The solar panel works at the maximum power point Wmp=Imp×Vmp; and the combination of the solar panel and the LMU outputs Wmp=Iout×Vout (since the LMU does not itself create power, and the power consumed by LMU is negligible).

In the parallel configuration, each of the solar panels is connected to an LMU to boost the voltage output Vout (while keeping the solar panel at its maximum power point Wmp=Imp×Vmp=Iout×Vout, thus reducing Iout). The solar panels are connected in parallel to a high voltage DC bus via their LMUs; and the DC bus can be used to power an inverter, which is tied to a power grid, to supply the grid.

In the serial configuration, each of the solar panels is connected to an LMU to boost the current output Iout (while keeping the solar panel at its maximum power point Wmp=Imp×Vmp=Iout×Vout, thus reducing Vout). The solar panels are connected in series via their LMUs; and the string of the solar panels (a serial power bus) can be used to power an inverter, which is tied to a power grid, to supply the grid.

In various embodiments, LMUs may have the following features:

a. LMUs for parallel connections are used to boost voltage (Vout>Vmp). Each parallel LMU has a step up converter and has a maximum power point tracking circuit. Parallel LMUs are configured to output a substantially fixed voltage, allowing only very small variations from the nominal voltage of the high voltage DC bus.

b. LMUs for series connections typically boost current (Iout>Imp). The serial LMUs do not use step up converters or maximum power point tracking circuits. Serial LMUs receive duty cycles from a system management unit (e.g., master management unit 130), which coordinates the output of the serial LMUs to improve the performance of the system. The system management unit adjusts the duty cycles of the serial LMUs to adjust the states of their respective solar panels.

In one embodiment, a solar panel has a few strings of solar cells (e.g., three solar cell strings per module). A local management unit can be applied to a group of cells within a string of an individual solar panel, or in some cases to each cell in a solar panel. A group of solar cells that are attached to a local management unit may be connected to each other in series, in parallel, or in a mesh configuration. A number of local management units connect the groups of the solar cells in a string to provide output for the solar panel. The foregoing is described further in U.S. Pat. No. 7,602,080, filed Oct. 13, 2009, entitled "Systems and Methods to Balance Solar Panels in a Multi-Panel System" by Hadar et al. (see, e.g., FIG. 5), the entire contents of which is incorporated by reference as if fully set forth herein. Some embodiments of the disclosure include methods to determine the duty cycles and/or phases for local management units connected to a string or mesh of solar modules.

In one embodiment, the system management unit controls the operations of the LMUs via a communication connection, which may be over the power line through which the solar panels deliver power, or over wireless connections, or via separate communication lines (e.g., as discussed above for FIG. 1). In one embodiment, as a safety feature, each LMU may have a watchdog circuit, which cuts off its output if the heartbeat signal from the system management unit is missing. This allows the solar system to be completely shut down remotely (e.g., for fire-fighting, or cleaning, etc.).

In one embodiment, the MMU listens for new LMUs that may be attempting to communicate with the MMU, for example during set up of a new system, or during replacement of an LMU. The MMU may listen on certain predefined channels (e.g., selected communication frequencies) known to the LMU. After the LMU establishes communication with the MMU, the LMU restarts and again establishes communication with the MMU, but does so on a different channel different from these predefined channels. A remote server or other computer system may be used to provide configuration profiles to the MMU (e.g., over the Internet). This permits a local photovoltaic system to be configured remotely by providing updated profiles to the MMU, then restarting one or more LMUs using the new profiles.

In one embodiment, a plurality of local management units are configured to, under supervision of a master management unit, balance currents between the plurality of solar modules in the power bus. In one embodiment, the LMUs may be configured to balance voltages and currents between solar modules and between power buses. The LMUs can be implemented serially or in parallel. The foregoing configurations are further described in U.S. Pat. App. Pub. No. 2010/0139734, published Jun. 10, 2010, entitled "Systems and Methods for an Enhanced Watchdog in Solar Module Installations", the entire contents of which publication is incorporated by reference as if fully set forth herein.

Figure 2:
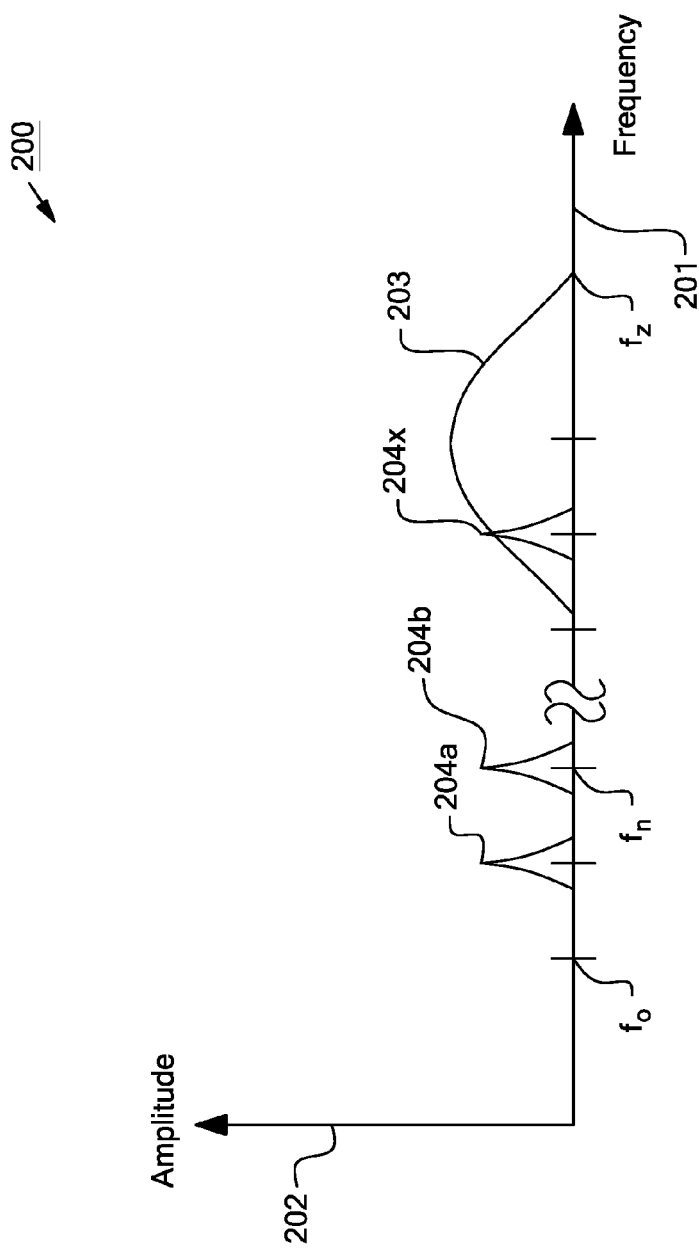
FIG. 2 shows a graph of the relationships of frequency vs. amplitude (with an amplitude axis and a frequency axis) for exemplary communication channels of a local management unit (LMU) according to one embodiment.

FIG. 2 shows a graph 200 of the relationships of frequency vs. amplitude, with amplitude axis 202 and frequency axis 201 in one embodiment. FIG. 2 illustrates exemplary communication channels used by an LMU to communicate with the MMU. Shown on frequency axis 201 are a number of channels f0-fz, with channel fn being the actual active channel in use. Also shown are exemplary signals 204a, 204b, and 204x corresponding to communication on these channels. In this example, a number of channels are covered by a disturbing interference 203 (e.g., interference from a microwave nearby). This interference may cause communications with the MMU to fail, and thus require the use of an alternate active channel.

Figure 3:
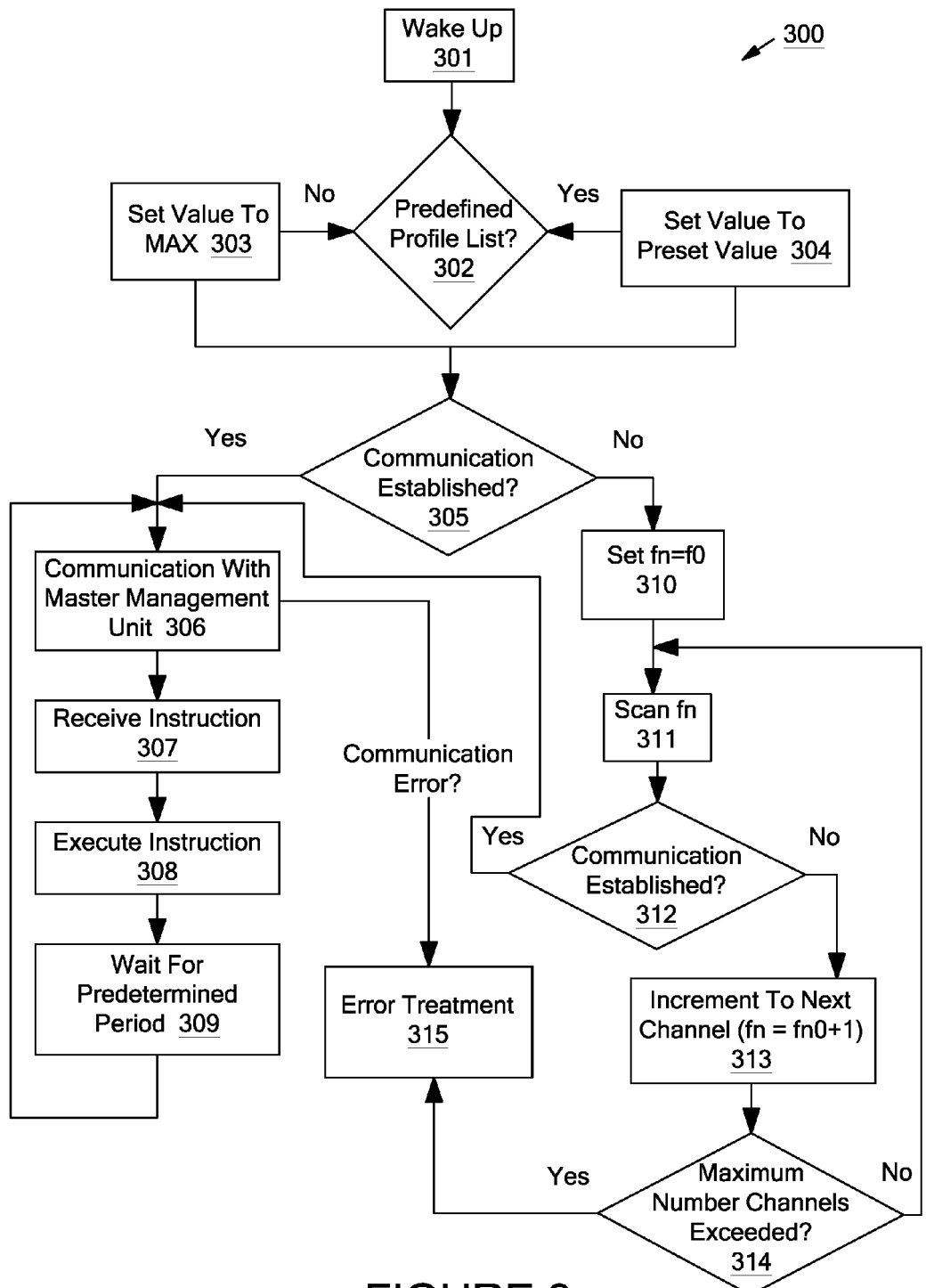
FIG. 3 is a flowchart illustrating a process for implementation of a communication protocol in an LMU according to one embodiment.

FIG. 3 shows an exemplary process 300 in one embodiment for implementation of a communications protocol in an LMU. More specifically, FIG. 3 illustrates a protocol for an LMU to communicate with an MMU in one embodiment. In one embodiment, the protocol supports the automatic self-configuration of the LMU.

In step 301, the LMU unit wakes up. In step 302, the system checks to determine whether it has a predefined profile list of starting values (e.g., the output voltage for the solar panel controlled by the LMU; or power level and/or initial channel to use for communications). If not (No), in step 303, the system sets a maximum value (e.g., maximum communications power or a default active channel). The maximum value may typically be for the output voltage that particular LMU contributes to its string, except in cases where local regulations require that the value be set lower than the maximum.

If the system finds a preset value in a profile (Yes), in step 304 the system sets the LMU at the preset value(s). Once the value is set for LMU operation in either step 303 or step 304, communication is attempted with the MMU on a first active channel. In step 305, the system checks to determine whether communication with the MMU has been established.

If communication is established (Yes), in step 306 the system communicates with the MMU in step 306 and in step 307, it receives one or more instructions from the MMU. In step 308, the system executes the instruction(s) it has received. In step 309, the system waits for a period (e.g., 1-5 seconds) whose value is contained in its profile list, and then it repeats the communication loop beginning again at step 306.

In cases where a communication error occurs in step 306, the system moves to step 315 and commences an error treatment protocol, for example as described below or otherwise. Examples of errors may include detection of a non-existing command, a mismatch in the MMU identification number, etc.

If the system finds, in step 305, that communication is not established (No), in step 310 the system attempts to establish communication by setting the channel fn to the frequency of initial active channel f0 and, in step 311, scanning fn. In step 312, the system checks to see if communication is then established on this new active channel. If it is (Yes), the system continues to the sequence of steps starting with step 306, as described above. If, in step 312, communication is not established (No), in step 313 the system increments the then-active channel fn to the next available channel f0+1 (i.e., channel f1).

In step 314, the system checks to see if the next incremental channel exceeds the maximum number of available channels (e.g., a predetermined maximum number of channels stored in the LMU start-up profile). If the maximum is not exceeded (No), the system returns to step 311 and continues to scan succeeding active channels until either it establishes communication or it exceeds the maximum number of channels. In the case of exceeding the maximum number of available channels in step 314 (Yes), the system moves to step 315 and commences an error treatment protocol. An error treatment protocol may include one or more of various approaches. One typical approach would reset the LMU and start again at step 301. Another approach would shut down the LMU; while yet another would loop back to step 305 and try again.

The section below entitled "EXEMPLARY PROTOCOL COMMUNICATION INFORMATION" shows specific examples of the protocol of communications between an exemplary distributed LMU and an exemplary MMU. This protocol shows how a system can self-detect elements, available channels, etc., thus reducing setup efforts. This is advantageous with the use of wireless communications, as channels may be blocked by outside sources of interference (e.g., as discussed for FIG. 2 above), and the system desirably should be able to self-reconfigure in such situations.

Figure 4:
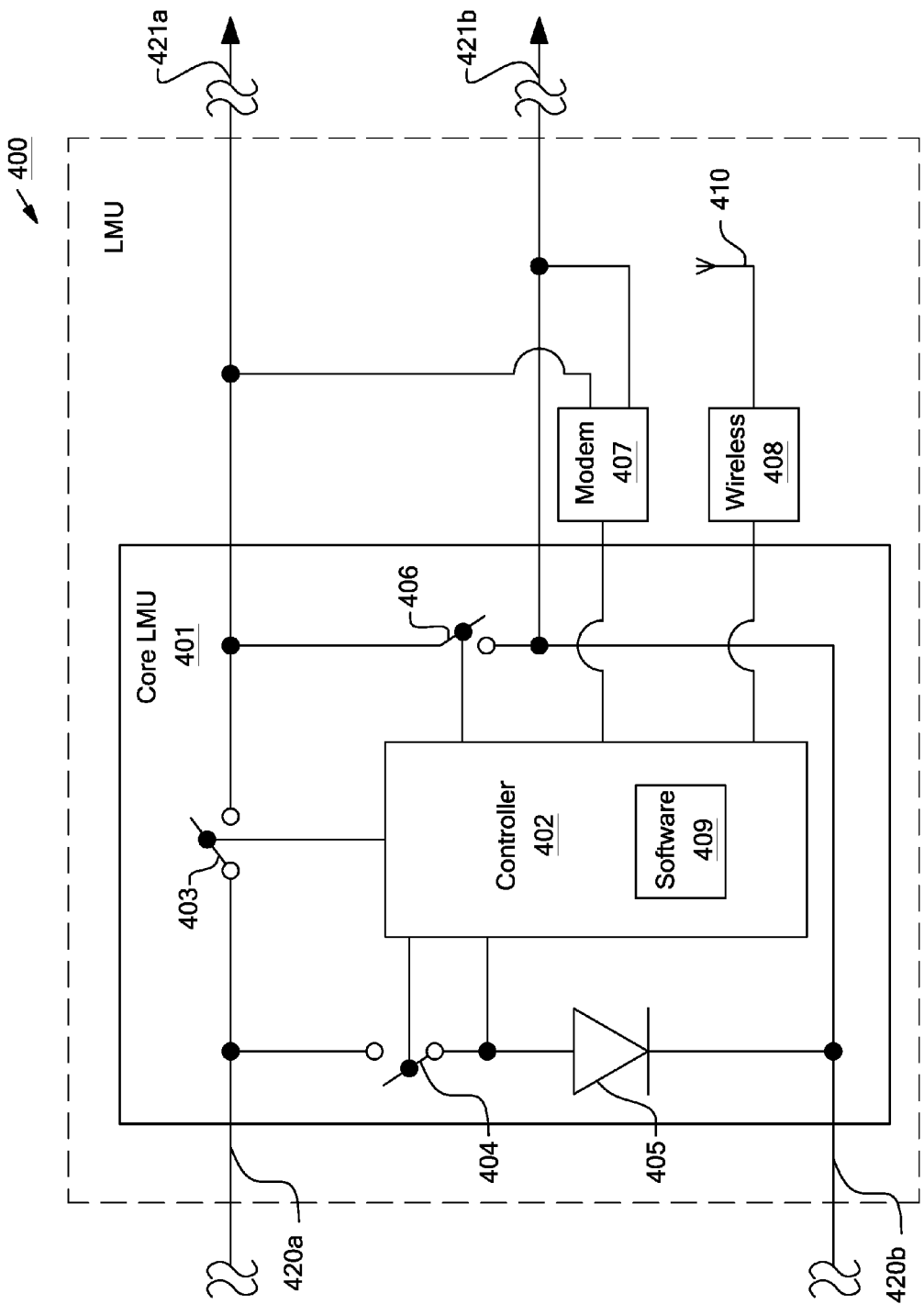
FIG. 4 is a circuit diagram illustrating a local controller or LMU according to one embodiment.

FIG. 4 shows an exemplary local controller or LMU 400 according to one embodiment. Wires 420a,b are connected to a solar panel 110 or 120 (i.e., to provide incoming electricity). Wires 421a,b are used to chain the LMUs together to form a string, as in the serial configuration illustrated in FIG. 1. The hardware of LMU 400 is configured for use in such a serial connection.

Core LMU 401 has switches 403, 404 and 406, plus controller 402. A diode 405 provides a voltage drop in the case of a short of switch 404, to ensure enough voltage to operate controller 402. Modem 407 and/or wireless network interface 408 are coupled to controller 402 to permit communications with the LMUs. In some cases, modem 407 connects to the string wiring 421a,b (e.g., to modulate control signals onto the wiring 421a,b at control frequencies higher than the normal operating frequencies used in power busses 150 and 160).

In other cases, wireless network interface 408 has an antenna 410 to use for communications with the LMUs. The network communications type used may be one of many different types of conventional wireless networks. The use of wireless communication may be advantageous in some cases by reducing the number of hardwire points of failure, and thus increasing the simplicity of system setup or the reliability of system operation.

In most cases, an LMU does not have both a modem 407 and a wireless network interface 408. Typically, a system contains only one or the other, but in some cases, these may be, for example, plug-in modules. In other cases, both components may be present, but only one may be activated. Controller 402 may be configured for operation by additional software code 409 that may include, in addition to other previously discussed features for a communication protocol, code for implementing a shut-off system.

Figure 5:
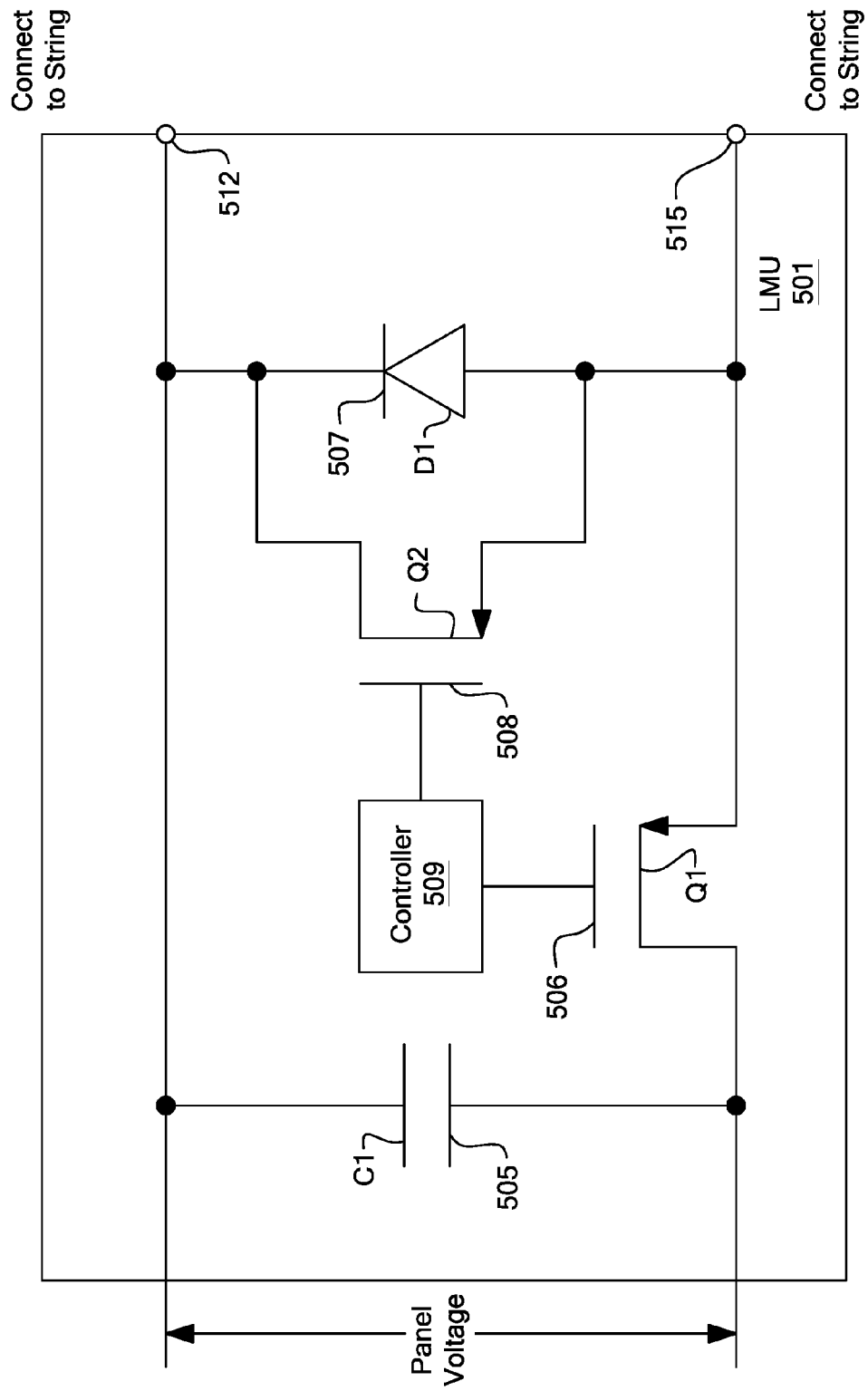
FIG. 5 is a circuit diagram illustrating an LMU providing two connectors for serial connections with other LMUs to form a serial power bus according to one embodiment.

In FIG. 5, a local management unit 501 according to another embodiment is illustrated. Local management unit 501 provides two connectors 512 and 515 for serial connections with other local management units 501 to form a serial power bus (e.g., power bus 150 or 160 of FIG. 1). Note that in other embodiments, a parallel configuration of LMUs may be used.

A controller 509 controls the states of switches Q1 506 and Q2 508. When the controller 509 turns on switch 506, the panel voltage and the capacitor C1 505 are connected in parallel to the connectors 512 and 515. The output voltage between the connectors 512 and 515 is substantially the same as the output panel voltage. During the period the switch 506 is turned off (open), the controller 509 turns on (closes) the switch Q2 508 to provide a path around the diode D1 507 to improve efficiency.

When the switch 506 is turned off (open), the panel voltage charges the capacitor C1 505, such that when the switch 506 is turned on, both the solar panel and the capacitor 505 provides currents going through the connectors 512 and 515, allowing a current larger than the current of the solar panel to flow in the string (e.g., the serial power bus 150 or 160 of FIG. 1). When the switch 506 is turned off (open), the diode D1 507 also provides a path between the connectors 512 and 515 to sustain the current in the string, even if the switch 508 is off for some reason. In one embodiment, the controller 509 is connected (not shown) to the panel voltage to obtain the power for controlling the switches Q1 506 and Q2 508.

In one embodiment, the controller 509 is further connected (not shown) to at least one of the connectors 512 and 515 to transmit and/or receive information from the string. In one embodiment, the controller 509 includes sensors (not shown) to measure operating parameters of the solar panel, such as panel voltage, panel current, temperature, light intensity, etc.

Additional information regarding local management units, and the operation thereof, that may be used in some embodiments of the present disclosure is described in U.S. Pat. No. 7,602,080, filed Oct. 13, 2009, entitled "Systems and Methods to Balance Solar Panels in a Multi-Panel System," the entire contents of which is incorporated by reference as if fully set forth herein.

Figure 6:
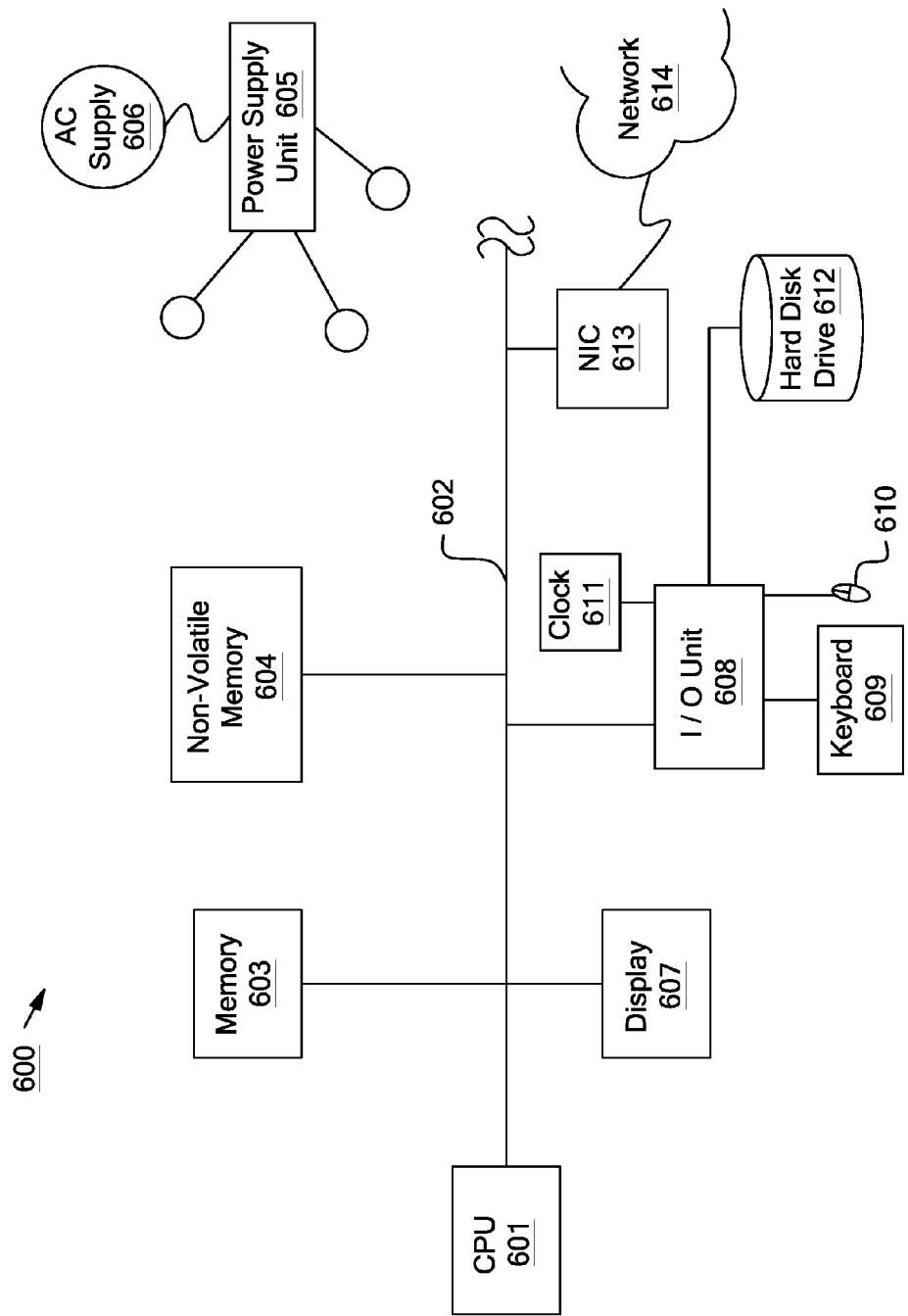
FIG. 6 is a block diagram illustrating an overview of a computer system that may be used for one or more components of the system of FIG. 1 according to various embodiments.

FIG. 6 shows an exemplary overview of a computer or data processing system 600 as may be used, in some embodiments, at various locations (e.g., for use as an MMU or an LMU) throughout system 100. It is generally exemplary of any computer that may execute code to process data. Various modifications and changes may be made to computer system 600 without departing from the broader spirit and scope of the system and method disclosed herein. For example, in various embodiments, computer system 600 may be used to implement processes, protocols, or methods described herein. For example, an MMU may be implemented via computer system 600. In other embodiments, LMUs are implemented via controllers, rather than use of a full computer system.

CPU 601 is connected to bus 602, to which bus is also connected memory 603, non-volatile memory 604, display 607, I/O unit 608, and network interface card (NIC) 613. I/O unit 608 may, typically, be connected to keyboard 609, pointing device 610, hard disk 612, and real-time clock 611. NIC 613 connects to network 614, which may be the Internet or a local network, which local network may or may not have connections to the Internet. Also shown as part of system 600 is power supply unit 605 connected, in this example, to AC supply 606. Not shown are batteries that may be present in some embodiments, and many other hardware devices and modifications thereof that are well known for use in such computer systems, but are not directly applicable to the specific novel functions of the system and method disclosed herein. Although FIG. 6 illustrates various components of a computer system, it is not intended to represent any particular architecture or manner of interconnecting the components. Other systems that have fewer or more components may also be used.

In other embodiments, typical I/O devices may include mice, modems, network interfaces, printers, scanners, video cameras and other devices which are well known in the art. The bus 602 may include one or more buses connected to one another through various bridges, controllers and/or adapters. In one embodiment, the I/O unit 608 includes a USB (Universal Serial Bus) adapter for controlling USB peripherals, and/or an IEEE-1394 bus adapter for controlling IEEE-1394 peripherals.

In other embodiments, memory may include ROM (Read Only Memory) and volatile RAM (Random Access Memory). Non-volatile memory may include, for example, a hard drive, flash memory, etc. Volatile RAM is typically implemented as dynamic RAM (DRAM) which requires power continually in order to refresh or maintain the data in the memory. Non-volatile memory is typically a magnetic hard drive, a magnetic optical drive, or an optical drive (e.g., a DVD RAM), or other type of memory system which maintains data even after power is removed from the system. The non-volatile memory may also be a random access memory.

The non-volatile memory can be a local device coupled directly to the rest of the components in the data processing system. A non-volatile memory that is remote from the system, such as a network storage device coupled to the data processing system through a network interface such as a modem or Ethernet interface, can also be used.

In some embodiments, one or more servers of the system can be replaced with the service of a peer to peer network of a plurality of data processing systems, or a network of distributed computing systems. The peer to peer network, or a distributed computing system, can be collectively viewed as a server data processing system.

Embodiments of the disclosure can be implemented via the processor(s) 601 and/or the memory 603/604. For example, the functionalities described can be partially implemented via hardware logic in the processor(s) 601 and partially using the instructions stored in the memory 603 and/or 604. Some embodiments are implemented using the processor(s) 601 without additional instructions stored in memory. Some embodiments are implemented using the instructions stored in the memory for execution by one or more general purpose microprocessor(s). Thus, the disclosure is not limited to a specific configuration of hardware and/or software.

As mentioned previously above, examples of additional communications protocol embodiments are described further in the section below entitled "EXEMPLARY PROTOCOL COMMUNICATION INFORMATION". Specific examples of communication packet data structures and communication commands that may be used in specific implementations of the various embodiments described above are included in this section.

In one embodiment, communications are attempted using this exemplary communication protocol, from a first local management, on a first active channel with the MMU. Next, it is determined if communication with the MMU has been established. In response to a determination that the communication on the first active channel has not been established, communication is attempted on a second active channel with the MMU, the second active channel having a frequency different from the first active channel. Then, it is determined if communication with the master management unit on the second active channel has been established. If so, then the LMU continues with a configuration or start-up process.

In one embodiment, the method further comprises after the communication on the second active channel has been established, receiving a first communication from the master management unit. In one embodiment, the first communication comprises an instruction (e.g., a command), and the method further comprises executing the instruction on the first local management unit. In one embodiment, the plurality of local management units are connected in series. In another embodiment, the plurality of local management units are connected in parallel.

In one embodiment, the communication on the first active channel is at a predetermined frequency used by the master management unit for establishing communication with new local management units being added to the system. In one embodiment, the method further comprises after communication with the master management unit has been established, restarting the first local management unit and subsequently communicating with the master management unit at a frequency other than the predetermined frequency.

In one embodiment, the method further comprises communicating from the first local management unit to the master management unit an identification code (e.g., Unit ID) associated with the first local management unit; and receiving a profile from the master management unit, the profile corresponding to the identification code. In one embodiment, the method further comprises in response to receiving the identification code, retrieving, via the master management unit, the profile from a database that includes a plurality of different profiles suitable for configuration of local management units.

In one embodiment, the first local management unit comprises an antenna, and the attempting to communicate on the first active channel comprises sending a wireless signal via the antenna. In one embodiment, the method further comprises after the communication on the second active channel has been established, determining that an error has occurred in communication with the master management unit; and in response to the error, initiating an error treatment protocol for the first local management unit.

In one embodiment, the method further comprises: in response to a determination that the communication on the second active channel has not been established, attempting to communicate on a third active channel with the master management unit, the third active channel having a frequency different from the first and second active channels; determining if communication with the master management unit on the third active channel has been established; in response to a determination that the communication on the third active channel has not been established, determining whether a predetermined number of available channels for communication with the master management unit has been exceeded; and in response to a determination that the predetermined number has been exceeded, initiating an error treatment protocol for the first local management unit.

In one embodiment, the method further comprises: prior to the attempting to communicate on the first active channel, waking up the first local management unit; after the waking up, determining whether the first local management unit is storing a configuration profile; in response to a determination that the first local management unit is not storing the configuration profile, communicating to the master management unit a first identification code associated with the first local management unit; receiving a first profile from the master management unit, the first profile corresponding to the first identification code, and the first profile including a time period; and configuring the first local management unit using the first profile.

In one embodiment, the method further comprises: after the communication on the second active channel has been established, receiving a first instruction from the master management unit; executing the first instruction on the first local management unit; after the executing the first instruction, waiting for the time period; after the waiting, communicating with the master management unit to receive a second instruction; and executing the second instruction on the first local management unit.

In one embodiment, the method further comprises: establishing communication with the master management unit from a second local management unit of the plurality of local management units; and communicating to the master management unit a second identification code associated with the second local management unit; receiving a second profile from the master management unit, the second profile corresponding to the second identification code; and configuring the second local management unit using the second profile.

In one embodiment, a local management unit comprises memory storing software instructions, and a controller coupled to the memory. The controller is configured via the software instructions to execute a method comprising: controlling, under supervision by a master management unit, a first solar module of a plurality of solar modules, the master management unit coupled to supervise a plurality of local management units, wherein the plurality of local management units are coupled by a power bus, and each one of the plurality of local management units controls a respective one of the plurality of solar modules, attempting to communicate on a first active channel with the master management unit, determining if communication with the master management unit on the first active channel has been established, in response to a determination that the communication on the first active channel has not been established, attempting to communicate on a second active channel with the master management unit, the second active channel having a frequency different from the first active channel, and determining if communication with the master management unit on the second active channel has been established.

In one embodiment, the system further comprises a modem or wireless network interface to attempt to communicate with the master management unit on the first active channel. In one embodiment, the plurality of local management units are configured to, under supervision of the master management unit, balance currents between the plurality of solar modules in the power bus.

In one embodiment, a non-transitory computer-readable storage medium tangibly stores computer readable instructions. The instructions cause a computer or data processing system to perform a method comprising: attempting to communicate, from a first local management unit of a plurality of local management units, on a first active channel with a master management unit, each of the plurality of local management units coupled to control a respective solar module of a plurality of solar modules; determining if communication with the master management unit on the first active channel has been established; in response to a determination that the communication on the first active channel has not been established, attempting to communicate on a second active channel with the master management unit, the second active channel having a frequency different from the first active channel; and determining if communication with the master management unit on the second active channel has been established.

In one embodiment, method further comprises: communicating from the first local management unit to the master management unit an identification code associated with the first local management unit; and receiving a profile from the master management unit, the profile corresponding to the identification code.

Remote or Local Shut-Off of Photovoltaic System

Various embodiments of systems and methods for remote or local shut-off of a photovoltaic system are now described below in more detail. In one embodiment, a method includes: communicating, via a central controller (e.g., master management unit 130 as described above), with a plurality of local management units (LMUs), each of the LMUs coupled to control a respective solar module; receiving, via the central controller, a shut-down signal from a user device (e.g., a hand-held device such as a Blackberry mobile phone, a computer such as a Dell desktop computer, or a wireless switch unit such as a button coupled to communicate an off-signal via a radio); and in response to receiving the shut-down signal, shutting down operation of the respective solar module for each of the LMUs.

In one embodiment, the wireless switch unit comprises a radio configured to transmit the shut-down signal. In one embodiment, the wireless switch unit further comprises a battery, and the radio is further configured to transmit a charge status of the battery to the central controller.

In another embodiment, the hand-held device is configured to wirelessly communicate the shut-down signal. The hand-held device may comprise a transceiver for voice communications, and the hand-held device may be further configured to receive a user input via a web page displayed on the device, the user input to initiate sending of the shut-down signal to the central controller. In one example, the hand-held device may receive an access code from a user prior to providing access to the web page (e.g., to provide security and prevent unauthorized access).

In one embodiment, the computer is configured to wirelessly communicate the shut-down signal, the computer comprises at least one processor and a display, and the at least one processor is configured to present, via the display, a user interface to receive input requesting communication of the shut-down signal.

In one embodiment, the central controller comprises a controlling block (e.g., software executing on a processor of the central controller), each of the LMUs comprises respective software configured to receive commands from the central controller, and the shutting down the operation comprises sending, via the controlling block, a shut-down command to the respective software of each LMU.

In one embodiment, the central controller and the user device are each coupled to communicate with a web server, and the shut-down signal is received by the central controller via the web server. In one embodiment, the user device displays a web page hosted by the web server, and the web page is configured to receive a user input, and the method includes sending the shut-down signal in response to receiving the user input. In one embodiment, the method further comprises identifying the user device based on a GPS location of the user device or a local area network identifier of the user device.

In one embodiment, the shutting down the operation comprises sending a shut-down command to each of the LMUs to shut down operation of the LMU's respective solar module. In another embodiment, the method includes sending pulse or heartbeat signals to each of the LMUs during normal operation, and the shutting down the operation is accomplished by terminating the sending the pulse or heartbeat signals.

In one embodiment, a local management unit comprises memory storing software instructions; and a controller coupled to the memory, the controller configured via the software instructions to execute a method comprising: controlling, under supervision by a central controller, a first solar module of a plurality of solar modules, the central controller coupled to supervise a plurality of local management units, wherein the plurality of local management units are coupled by a power bus; and receiving a shut-down command from the central controller to shut down operation of the first solar module, wherein the central controller sends the shut-down command in response to receiving a shut-down signal from a user device (e.g., a hand-held device, a computer, or a wireless switch unit).

In one embodiment, the method further comprises receiving communications from the central controller, the communications including a first communication, and determining whether the first communication includes the shut-down command. In response to receiving the shut-down command, operation of the first solar module is shut down (e.g., via control actions by the LMU). In one embodiment, this shut-down may correspond to a reduced power or voltage level of operation of a solar module, rather than a complete shutting down of all power or voltage.

In one embodiment, the method may further comprise determining whether the first communication is received after a time-out occurs, and shutting down operation of the first solar module in response to the time-out. The time-out may occur, for example, if a watchdog timer started after receipt of a prior communication expires before a subsequent communication (i.e., the first communication) is received.

In one embodiment, the local management unit comprises at least one communication device (e.g., a modem) for communicating with the central controller, and the method further comprises verifying operation of the at least one communication device (e.g., determining that the modem is working properly).

In one embodiment, a non-transitory computer-readable storage medium tangibly stores thereon computer readable instructions, the instructions causing a data processing system to perform a method, the method comprising: receiving, via a local management unit, communications from a central controller; controlling, via the local management unit, a solar module; determining whether the communications include a shut-down command; and in response to receiving the shut-down command, shutting down operation of the solar module, wherein the central controller sends the shut-down command in response to receiving a shut-down signal from a user device.

In some embodiments, a watchdog system for shut-down of a photovoltaic system (e.g., a system using a watchdog timer approach similar to the system described earlier above) may be used for various types or kinds of emergencies that may arise. Other than for this use of a watchdog system, an operator-initiated emergency shut-down or shut-off system may be needed or desired in cases such as situations that are not precipitated by a loss of connectivity to a central controller, etc. (i.e., an event or emergency that is not of a type that the watchdog system is designed to handle), but that still requires a photovoltaic system shut-down to create a safe environment for personnel such as firemen, service technicians, etc., or a shut-down for other reasons.

As mentioned above, solar system installers take a large guard band (or safety margin) to make sure voltages don't cross the 600V or 1000V limits in the United States and the European Union. That limitation inhibits them from installing a larger number of solar panel modules in series, which increases the balance-of-system costs due to the need for a larger number of combiner boxes or string inverters. When solar modules are connected in series or in mesh configurations, there can be a problem whereby weaker modules not only produce less energy, but also affect other modules' capabilities to deliver energy in the same string or wiring section. Various embodiments of a system and method to shut down a photovoltaic solar panel system (PVSP), either locally and/or remotely, in a safer and more convenient manner are now described below.

Figure 7:
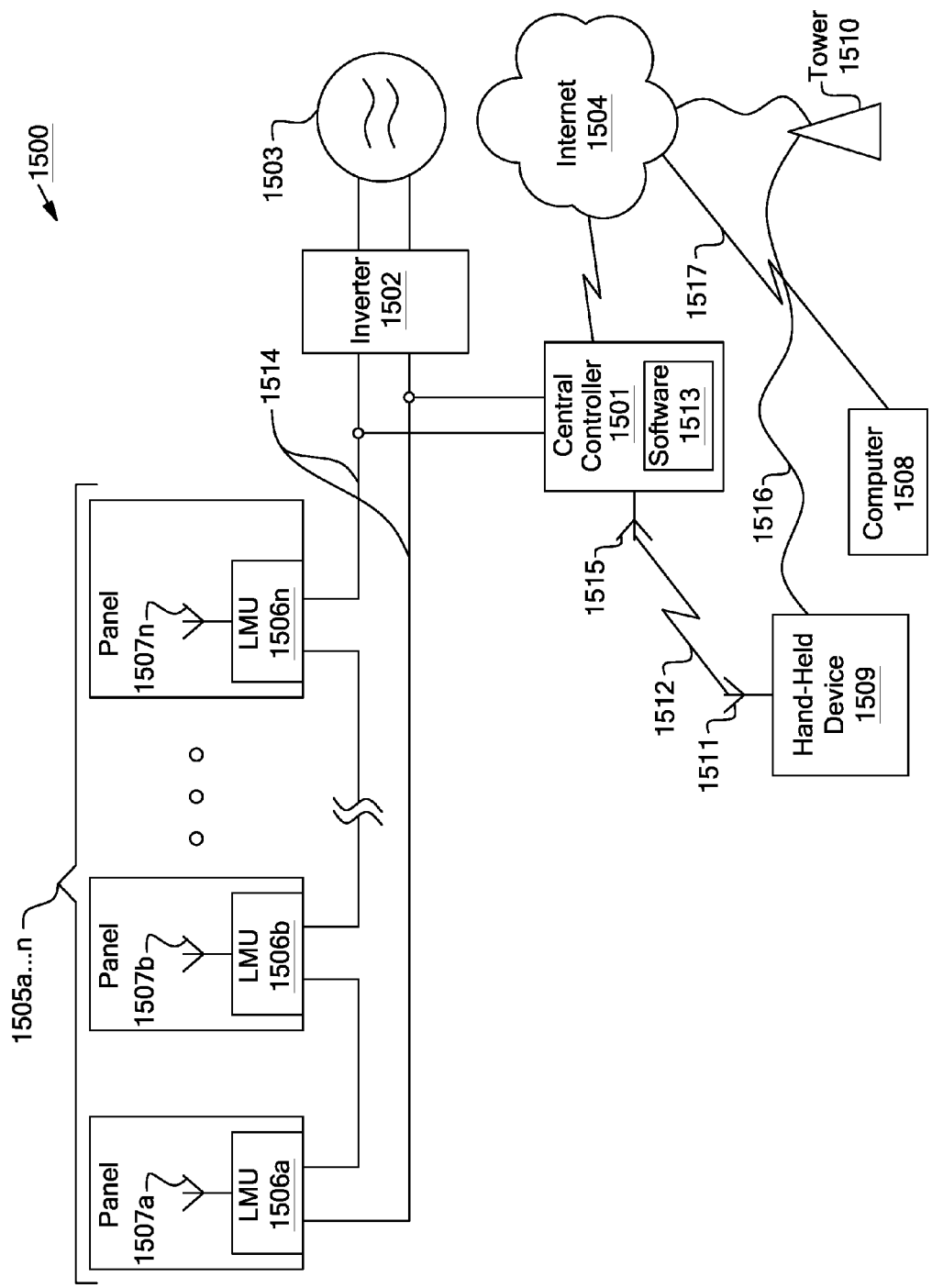
FIG. 7 shows an overview of a photovoltaic solar panel system according to one embodiment.

FIG. 7 shows an exemplary overview of a photovoltaic solar panel system 1500, according to one embodiment. Panels 1505a-n each have their own local management unit (LMU) 1506a-n (e.g., each LMU may be implemented using LMU 501 described above). These LMUs may have a means of communication, also as previously described, some of which may be wireless or in other embodiments use the wires of the string of solar panels. In this example of FIG. 7, string wiring 1514 connects a serial string to inverter 1502, which is connected to the AC power grid 1503 (note that connection and or combiner boxes are not shown, for simplicity and clarity, but may exist in various, different combinations and configurations).

A central controller 1501 (e.g., such as master management unit 130 described above) is connected to Internet 1504 (and/or another network in other embodiments). An example of a central controller 1501 is described in U.S. Pat. App. Pub. No. 2009/0234692, published Sep. 17, 2009, entitled "Method and System for Configuring Solar Energy Systems," which is hereby incorporated by reference as if fully set forth herein.

Central controller 1501 may contain a microprocessor running various different software instances, referred to in total as software 1513. Different sections or modules of this software may perform different tasks that are described below. Also, illustrated in FIG. 7 for this example are a hand-held device 1509 and a computer 1508 (e.g., a PC-type or desktop computer, or a laptop or tablet computer). In this exemplary illustration, computer 1508 is connected to Internet 1504 as indicated by connection 1517, but in other cases it may be connected wirelessly (not shown).

Hand-held device 1509 may connect wirelessly to a tower 1510 via a connection 1516, which tower 1510 then connects to a cell phone company (not shown) via, for example, the Internet. In other cases, hand-held device 1509 may use, for example, a wireless LAN (local area network) connection 1512 between a local LAN antenna 1511 and a wide area network (WAN) antenna 1515 at the central controller 1501. Also, in the case of a wireless implementation, each of LMUs 1506a-n has its own respective one of antennas 1507a-n.

In some cases, a gateway (not shown) may be connected to central controller 1501. A gateway may, for example, communicate with controller 1501 in any of three communication types: RS-485, DC-power line communication (DC-PLC), or wireless communication. In a typical system, this gateway uses RS-485 on one side and another means of communication, either DC-PLC or wireless, on the other side. The gateway typically is installed next to the solar panels, where there is better wireless reception, or may be tapped to the DC line for DC-PLC. In cases where the panels are not near a means of communication, controller 1501 may be placed next to the Internet in an electrical room (e.g., if the solar panels are located in a field, controller 1501 and/or the gateway can be placed in or near a utility room, rather than in the field). One or more gateways may connect to the central controller 1501 as needed or desired. In one example, where there only a single gateway is used, the gateway may be fitted inside the controller 1501.

Figure 8:
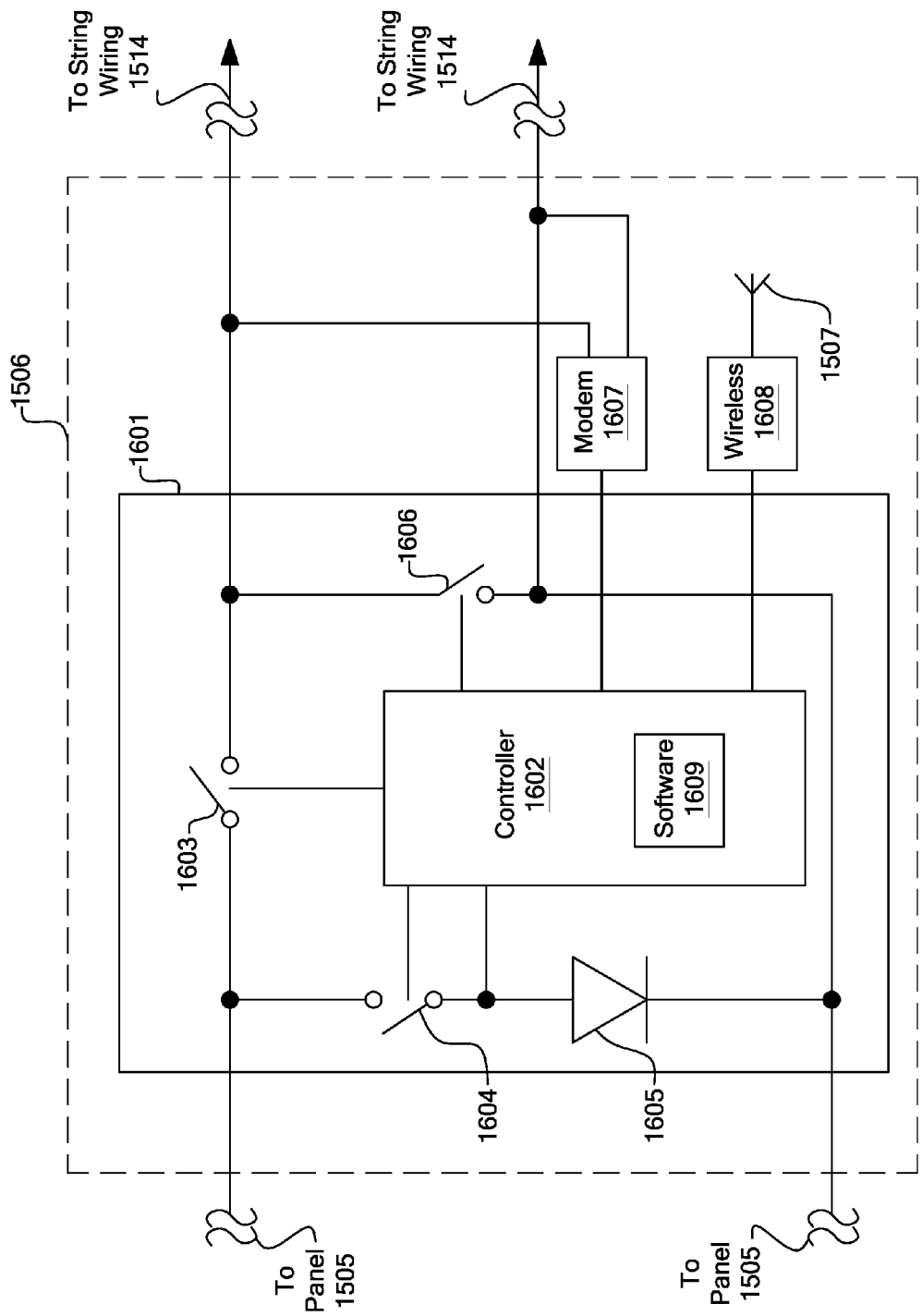
FIG. 8 shows an overview of an LMU according to one embodiment.

FIG. 8 shows an overview of an LMU 1506, according to one embodiment. Core LMU 1601 has switches 1603, 1604 and 1606, and also a controller 1602. A diode 1605 provides a voltage drop in the case of a short of switch 1604, to ensure enough voltage is available to operate controller 1602. A modem 1607 connects to the string wiring 1514. A wireless network interface 1608 has an antenna 1507. The network used may be one of many different types of wireless networks. In most cases, an LMU does not have both a modem 1607 and a wireless network interface 1608. Typically, a system contains only one or the other, but in some cases, these may be plug-in modules, or in yet other cases, both may be present, but only one may be activated. The controller 1602 contains software code 1609 that includes, in addition to any previously discussed LMU features that may be implemented, code to implement various shut-down functions on the LMU in support of the shut-down method described herein.

Figure 9:
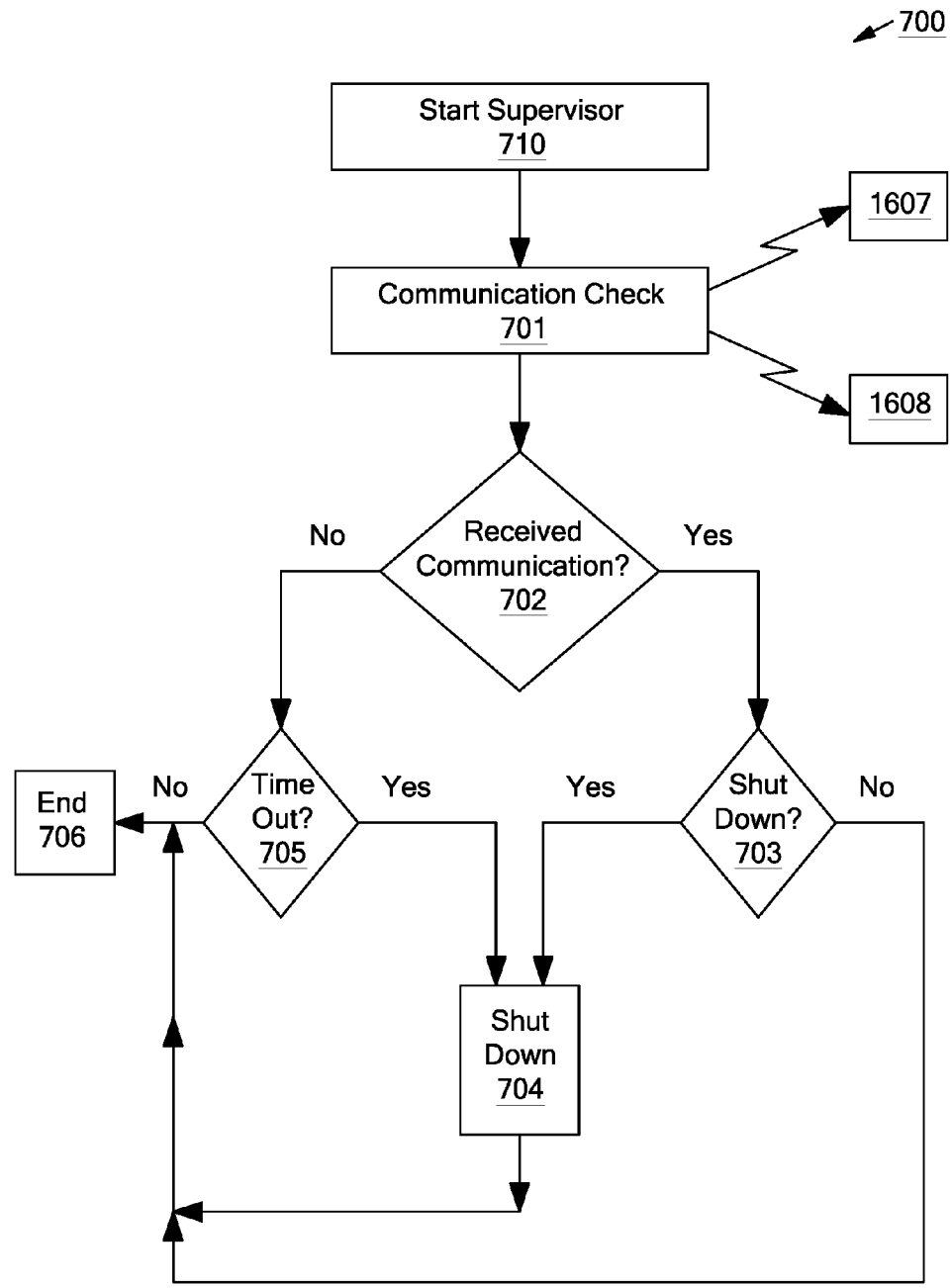
FIG. 9 is a flowchart illustrating a software code process for shut-off of a photovoltaic solar panel according to one embodiment.

FIG. 9 shows an exemplary software code process 700 (this may be, for example, a modified or enhanced version of the software or code for the watchdog as described in U.S. Pat. App. Pub. No. 2010/0139734, published Jun. 10, 2010, entitled "Systems and Methods for an Enhanced Watchdog in Solar Module Installations,", incorporated by reference above) used for implementation of the shut-down system (e.g., on software residing on LMU 1506; in other embodiments some of these functions may be implemented on other components of the system in communication with LMU 1506), according to one embodiment. In step 710, a watchdog (supervisory) process starts, based on a heartbeat or timer (e.g., periodically received from the central controller 1501), wherein certain events are checked on a regular basis. In step 701, the code checks to verify that the communication devices present in the solar panel system (e.g., devices in an LMU such as devices 1607 and 1608) are properly working.

In step 702, the code checks to see if the communication devices have received any communications since the last check. If not (no), the process moves to step 705, where, if the code detects no time-out (no) (e.g., by counting and/or using a watchdog timer as previously described), the process ends at step 706. At step 702, if the code detects that the communication devices have received a communication since the last check (yes), the process moves to step 703, where the code checks to see if the communication was a shut-down command. If not (no), the process again moves to step 706. If the communication was a shut-down command (yes), at step 704 the code implements a shut-down operation (e.g., shut-down of the solar panel 1505 connected to and controlled by LMU 1506) by adjusting switches 1603, 1604, and 1606 to shut down the attached solar module, and then the process moves to step 706. As previously described, the illustrated switches are indicated as mechanical switches, but in a typical implementation they are semiconductor-type switches, such as MOSFET transistors or other, similar switches, although they may be switches of any type suitable for the described function.

In step 705, if the code detects a time-out (yes), the process moves to a shut-down in step 704 (e.g., this is one exemplary, simplified embodiment of a watchdog). The two procedures (i.e., checking for a time-out command and checking for a shut-down command) may be completely independently, in which case the code would not check for a time-out; however, it often is desirable to combine them. Additional steps may be added to process 700 for further refinement or addition of other functions in various embodiments.

Figure 10:
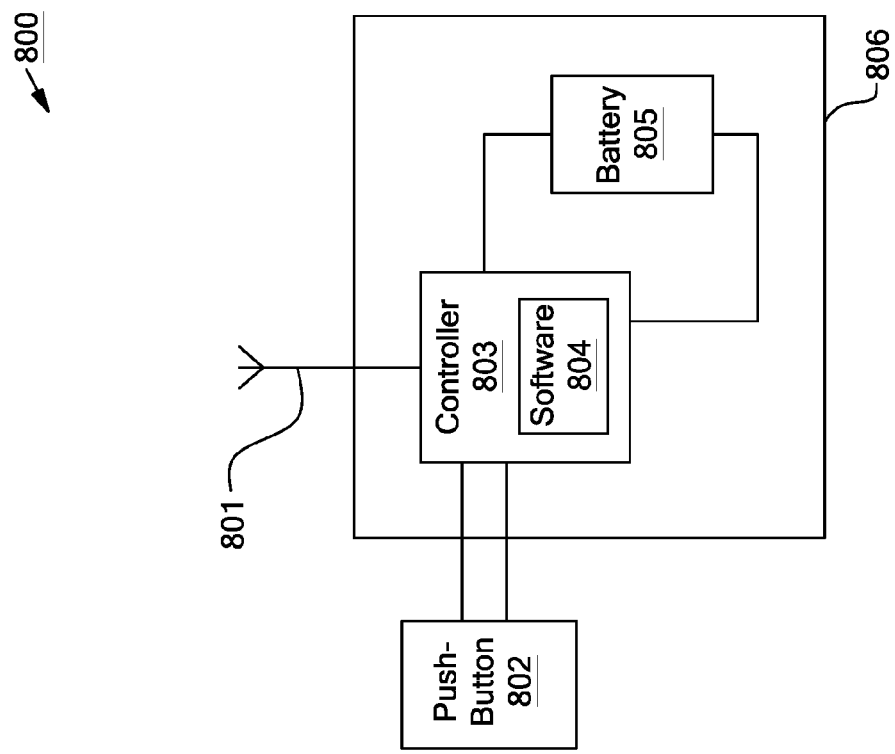
FIG. 10 shows an overview of a switch unit according to one embodiment.

FIG. 10 shows a simplified overview of an exemplary switch unit 800, according to one embodiment. Switch unit 800 is battery-operated, in this example, but might receive power over wiring from the central controller 1501, or solely from the AC grid, etc. It may, for example, contain a lithium battery 805 that typically lasts for several years. Also, shown are a controller 803, which has a radio, an external push-button 802, an enclosure 806, and antenna 801.

In alternative embodiments, switch unit 800 may use other types of mechanical switches or buttons in order to permit a user to activate a manual switching function by using switch unit 800. In addition, switch unit 800 may check in via its radio on a regular basis with the central controller 1501 (e.g., every 1-10 milliseconds, or every 5-30 seconds). It may also send other communications such as, for example, a report on the status of battery 805, so that the central controller 1501 may issue warnings for conditions such as low battery, intermittent battery, etc.

There may also be in some cases a separate watchdog monitoring for loss of signal between the switch unit 800 and the central controller 1501, in a manner similar to the examples described previously. One advantage of switch unit 800 is that it may be placed in a convenient location, where it may be the case that electrical system wiring is not accessible or not installed, but that switch unit 800 could be used to implement a system shut-down when needed (e.g., an emergency such as a fire). Alternatively, a shut-off switch may be wired directly into central controller 1501 (not shown).

Similar to some typical emergency switches, the button 802 may in some embodiments include a mechanical latching mechanism, enabling the system to remain off until a specific "un-latch" procedure is used, such as turning the button or a key. In these embodiments, the switch unit 800 may have a feedback mechanism to visually (e.g., by flashing light) or audibly (e.g., by sound generator via a speaker) indicate when the system has been and/or continues to be inactive. The switch unit 800 may be marked to identify its functionality and differentiate it from a traditional DC or AC disconnect mechanism.

Figure 11:
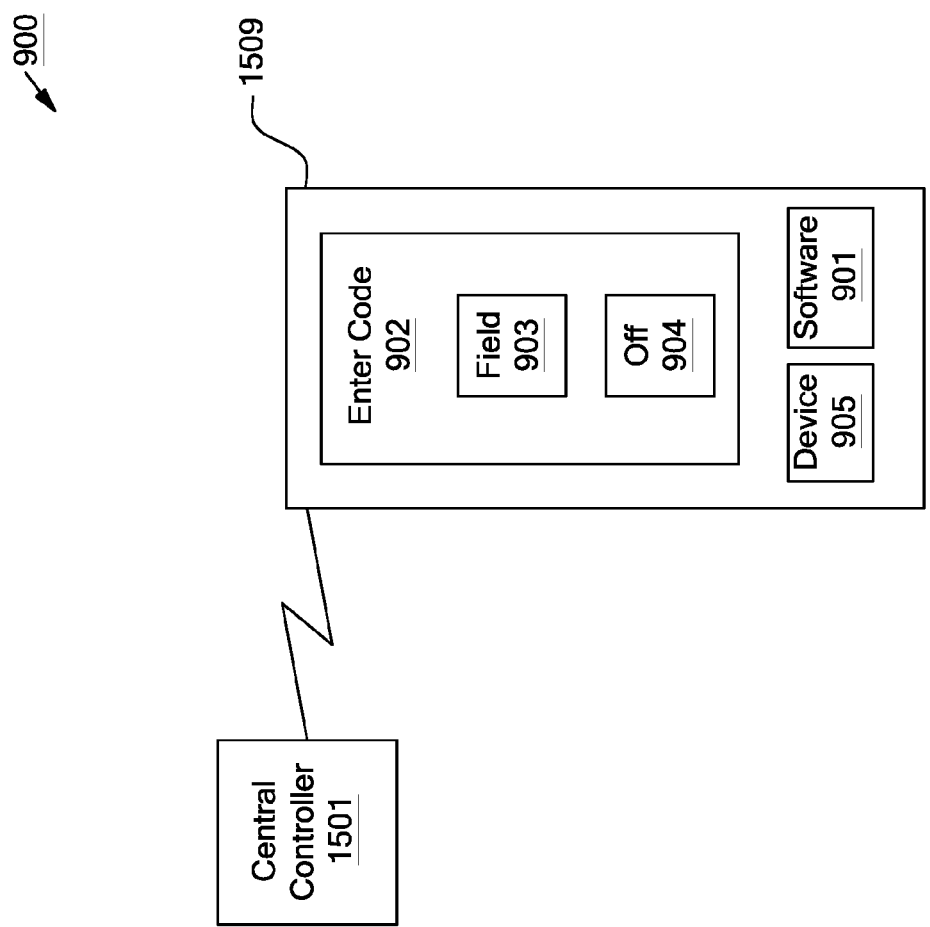
FIG. 11 shows a user interface configuration of a handheld device according to one embodiment.

FIG. 11 shows an exemplary user interface configuration 900, according to one embodiment. An exemplary hand-held device 1509 communicates wirelessly and may be, for example, a Blackberry® mobile communications device or an iPhone® mobile communications device or another, Internet-ready mobile communications device. In some cases, the device may not use Internet connectivity, but communicates using one of various available forms of wireless LAN connectivity. Hand-held device 1509 may communicate wirelessly with central controller 1501 (e.g., via a LAN or indirectly via an Internet server with which the hand-held device 1509 and central controller 1501 communicate).

In one embodiment, central controller 1501 identifies device 1509 based, for example, on a GPS location (e.g., as communicated from the device) or wireless LAN access, for which it is unnecessary for a user to enter an ID, as long as the device 1509 uses local access using, for example, a MAC ID for user identification. In such a case, a user would only enter his access code in field 903 (e.g., of user interface 902), and then by pushing button 904 the user could sign-off from this user function. Button or entry device 905 (e.g., a trackball) may be used to manipulate the system (e.g., manipulate an input function of the user interface 902 of device 1509).

In addition to the normal operating system of device 1509, code 901 is installed in device 1509 as, for example, an application or as a web browser plug-in, or as any combination thereof. The code 901 implements a process to communicate with controller 1501. In some embodiments, a web page may be hosted by central controller 1501. In other embodiments, one or more additional servers on the Internet (e.g., a web server, not shown) may be involved in providing this service of allowing communication between device 1509 and central controller 1501.

Figure 12:
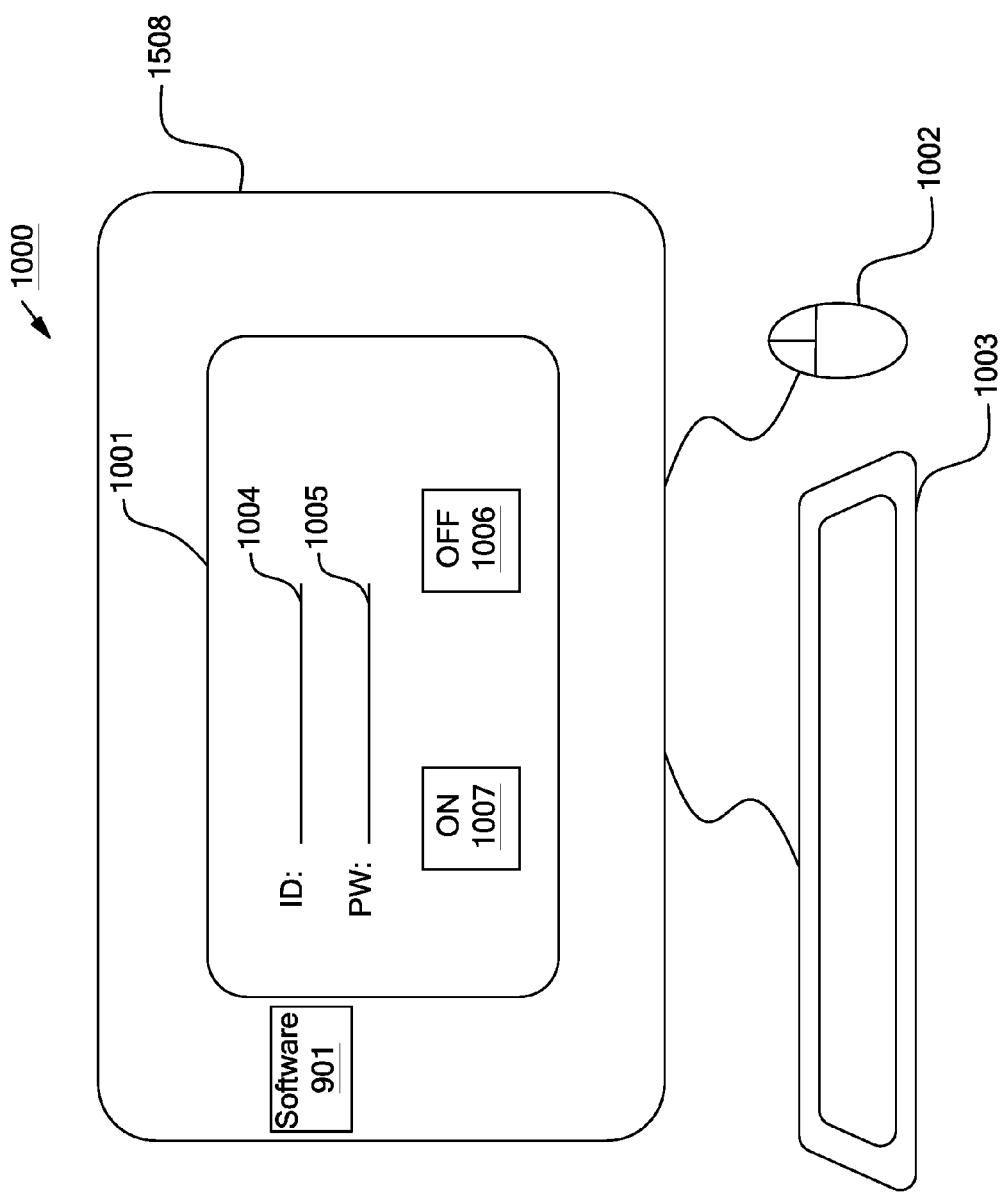
FIG. 12 shows a user interface configuration of a computer according to one embodiment.

FIG. 12 shows an exemplary user interface system configuration 1000 of a computer 1508 (e.g., a PC-type computer), according to one embodiment. Screen 1001 shows a typical login sequence of user ID 1004 and password 1005. Also shown on the screen 1001 are icons for an on-switch 1007 and off-switch 1006 for implementing on and off commands, respectively, in the software, as well as keyboard 1003 and pointing device 1002. Code instance 901 (e.g., adapted as appropriate for the hardware and operating system software of computer 1508) may be a downloadable application, a web browser plug-in, or a web page, in some cases with code or scripts executing on computer 1508.

Figure 13:
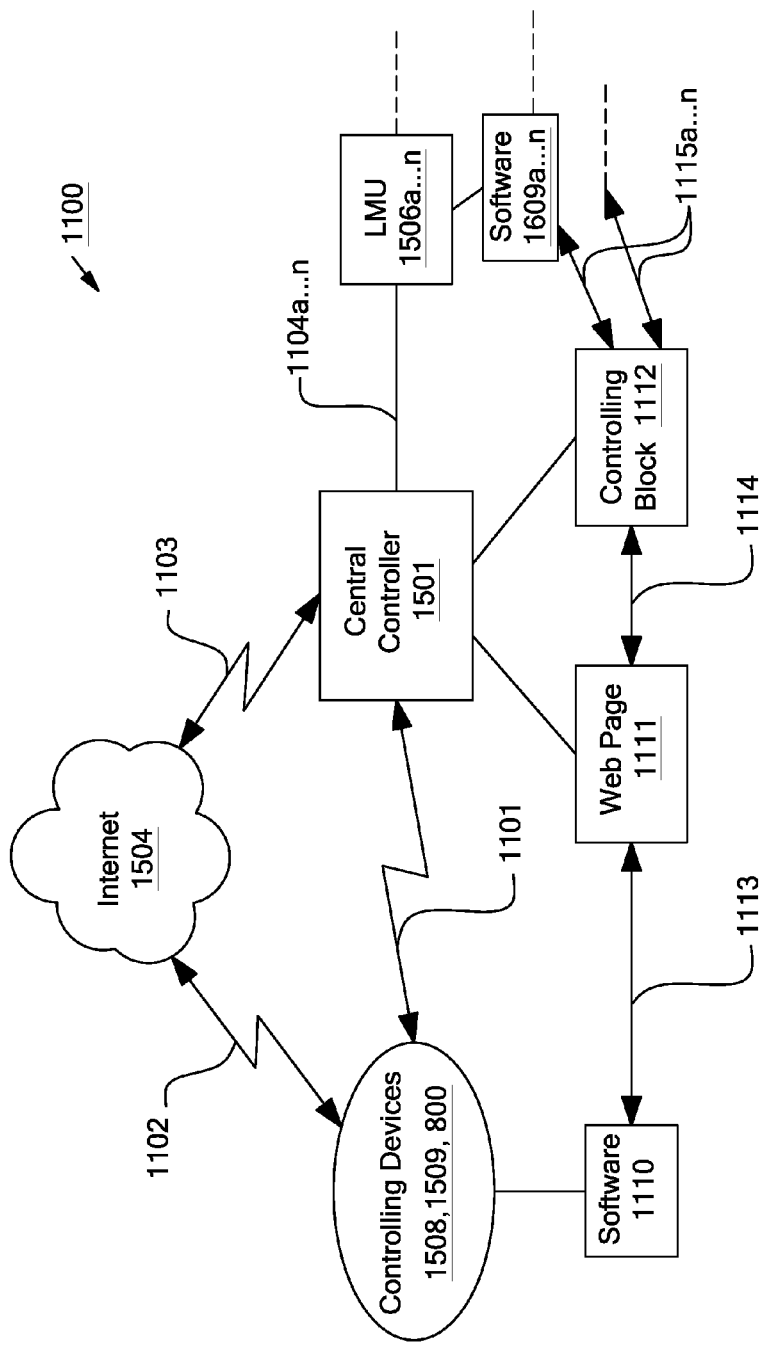
FIG. 13 shows a simplified overview of a logical communication system according to one embodiment.

FIG. 13 shows a simplified overview of a logical communication system 1100, according to one embodiment. On the left side of FIG. 13 are illustrated one or more of controlling devices 1508, 1509, and 800. These devices may communicate either via Internet 1504 and network communication connections 1102 and 1103 to controller 1501, or directly through WAN or wire 1101.

Logically, the respective software 1110 executing in devices 1508, 1509, and 800 communicates with web page software 1111 (e.g., residing on central controller 1501) to receive these communications with embedded commands, for example, such as shut-off, restart, or other command as may be used in the system. These commands are then interpreted and transferred internally through internal messaging 1114 to controlling block 1112 (e.g., implemented as software that resides on central controller 1501), which then sends out the commands through logical connections 1115*a-n* to software 1609*a-n* residing in each of LMUs 1506*a-n*. These LMUs are, in turn, connected to communication means 1104*a-n*, which may be either directly wired on the string wiring or wirelessly through either units 1608 or 1607, respectively, to central controller 1501.

In one embodiment, commands may be sent via communication means 1104*a-n*. In another embodiment, communication with each of the LMUs via communication means 1104*a-n* may be different and independent of communications via the logical connections 1115*a-n* (e.g., for implementing functions not controlled by the embedded commands). Also, a variety of different protocols, wired and/or wireless, may be used for communications via means 1104*a-n*. For example, each of LMUs 1506 may communicate with central controller 1501 via a different protocol.

In this description, various functions and operations may be described as being performed by or caused by software code to simplify description. However, those skilled in the art will recognize what is meant by such expressions is that the functions result from execution of the code by a processor, such as a microprocessor. Alternatively, or in combination, the functions and operations can be implemented using special purpose circuitry, with or without software instructions, such as using an Application-Specific Integrated Circuit (ASIC) or a Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

While some embodiments can be implemented in fully functioning computers and computer systems, various embodiments are capable of being distributed as a computing product in a variety of forms and are capable of being applied regardless of the particular type of machine or computer-readable media used to actually effect the distribution.

At least some aspects disclosed can be embodied, at least in part, in software. That is, the techniques may be carried out in a computer system or other data processing system in response to its processor, such as a microprocessor, executing sequences of instructions contained in a memory, such as ROM, volatile RAM, non-volatile memory, cache or a remote storage device.

Routines executed to implement the embodiments may be implemented as part of an operating system, middleware, service delivery platform, SDK (Software Development Kit) component, web services, or other specific application, component, program, object, module or sequence of instructions referred to as "computer programs." Invocation interfaces to these routines can be exposed to a software development community as an API (Application Programming Interface). The computer programs typically comprise one or more instructions set at various times in various memory and storage devices in a computer, and that, when read and executed by one or more processors in a computer, cause the computer to perform operations necessary to execute elements involving the various aspects.

A machine readable medium can be used to store software and data which when executed by a data processing system causes the system to perform various methods. The executable software and data may be stored in various places including for example ROM, volatile RAM, non-volatile memory and/or cache. Portions of this software and/or data may be stored in any one of these storage devices. Further, the data and instructions can be obtained from centralized servers or peer to peer networks. Different portions of the data and instructions can be obtained from different centralized servers and/or peer to peer networks at different times and in different communication sessions or in a same communication session. The data and instructions can be obtained in entirety prior to the execution of the applications. Alternatively, portions of the data and instructions can be obtained dynamically, just in time, when needed for execution. Thus, it is not required that the data and instructions be on a machine readable medium in entirety at a particular instance of time.

Examples of computer-readable media include but are not limited to recordable and non-recordable type media such as volatile and non-volatile memory devices, read only memory (ROM), random access memory (RAM), flash memory devices, floppy and other removable disks, magnetic disk storage media, optical storage media (e.g., Compact Disk Read-Only Memory (CD ROMS), Digital Versatile Disks (DVDs), etc.), among others.

In general, a machine readable medium includes any mechanism that provides (e.g., stores) information in a form accessible by a machine (e.g., a computer, network device, personal digital assistant, manufacturing tool, any device with a set of one or more processors, etc.).

In various embodiments, hardwired circuitry may be used in combination with software instructions to implement the techniques. Thus, the techniques are neither limited to any specific combination of hardware circuitry and software nor to any particular source for the instructions executed by the data processing system.

Although some of the drawings illustrate a number of operations in a particular order, operations which are not order dependent may be reordered and other operations may be combined or broken out. While some reordering or other groupings are specifically mentioned, others will be apparent to those of ordinary skill in the art and so do not present an exhaustive list of alternatives. Moreover, it should be recognized that the stages could be implemented in hardware, firmware, software or any combination thereof.

| EXEMPLARY PROTOCOL COMMUNICATION INFORMATION |
|---|
| A. Message Level |
| Command Summary |
| 0x02—data request |
| 0x03—data response |
| 0x04—request NO DATA response |
| 0x05—no data response |
| 0x06—general parameter error response |
| 0x08—send broadcast request |
| 0x09—send broadcast response |
| 0x0a—send version request |
| 0x0b—send version response |
| 0x0c—set channel |
| 0x0d—set channel response |
| 0x0e—read channel |
| 0x0f—read channel response |
| 0x10—Hard reset of Gateway |
| 0x11—Response to hard reset |
| 0x12—STORE settings |
| 0x13—Response to STORE settings |
| 0x14—Set unit ID |
| 0x15—Set unit ID response |
| 0x16—Get unit ID |
| 0x17—Get unit ID response |
| ---- diagnostic ------ |
| 0x100—Echo command |
| 0x101—Echo response |
| (0x02) Get data request: Sent to request lines of LMU data from the Gateway |
| <command> = 0x02 |
| <body> = <line count> <seq ID> |
| <line count> Number of lines desired, 16 bits, high byte first |
| <seq ID > Starting sequence number desired, 32 bits, high byte first |
| Responses: 0x03—data response; 0x05—no data response |
| (0x03) Data Response: Sent to supply LMU data to the MMU |
| <response> = 0x03 |

| EXEMPLARY PROTOCOL COMMUNICATION INFORMATION |
| --- |

<body> = <line count> <delimiter> <LMU line> ...
<line count> Count of available lines, 16 bits, high byte first
<delimiter> 0xDDDD, 16 bites, high byte first
<LMU line> = ....
(0x04) Get NO data request: Sent to request sequence number limits
<command> = 0x04
<body> = <empty>
Responses: 0x05—no data response
(0x05) No Data Response: Sent to indicate to the MMU that the requested sequence ID
is not yet in the buffer
<response> = 0x05
<body> = <Seq ID first> <Seq ID next>
<Seq ID first> First available Seq ID, 32 bits, high byte first
<Seq ID next> "Current" Seq ID (highest + 1), 32 bits, high byte first
(0x06) General parameter error response: Sent to indicate a parameter error.
<response> = 0x06
<body> = <empty>
(0x08) Send Broadcast Request: Sent to load data to the beacon payload in the Gateway
<command> = 0x08
<body> = <ascii bytes>
<ascii bytes> Up to 40 ascii bytes....
Responses: 0x09—send broadcast response
(0x09) Send Broadcast Response: Sent in response to a broadcast command
<command> = 0x09
<body> = <empty>
(0x0a) Send Version Request: Request version and build strings
<command> = 0x0a
<body> = <empty>
Responses: 0x0b—Send Version Response
(0x0b) Send Version Response
<response> = 0x0b
<body> = <version string> <build date> <build time>
<version string> Delimited ascii string (CR delimiter), Typ: "Gateway Version 00.6a"
<build date> Delimited ascii string (CR delimiter), Typ: "Build Aug 24 2009"
<build time> Delimited ascii string (CR delimiter), Typ: "10:00:38"
(0x0c) Set Channel Request: Sets new channel in gateway. Gateway is radio is then forcibly restarted with a hammer.
<command> = 0x0c
<body> = <desired channel>
<desired channel> Channel number between 11 and 26 (dec), 16 bit, high byte first
Responses: 0x06—Bad parameter response; 0x0d—Set Channel Response
(0x0d) Set Channel Response
<response> = 0x0d
<body> = <empty>
(0x0e) Get Channel Request
<command> = 0x0e
<body> = <empty>
<current channel> Channel number between 11 and 26 (dec), 16 bit, high byte first
Responses: 0x0d—Get Channel Response
(0x0f) Set Channel Response
<response> = 0x0d
<body> = <current channel>
<current channel> Channel number between 11 and 26 (dec), 16 bit, high byte first
(0x10) Request Gateway Reset: Gateway is put into hard reset
<command> = 0x10
<body> = <magic string>
<magic string> 0x37249266L—arbitrary...., 32 bit, high byte first
Responses: 0x06—General error response (bad magic number); 0x11—Get reset request Response
(0x11) Request Gateway Reset Response: In some embodiments, the gateway implementation does not finish the answer packet before resetting,
<response> = 0x11
<body> = <empty>
(0x12) STORE settings: Current parameters are formatted to a structure and written to Flash. A limited number of writes are allowed before the memory is filled up. Do NOT write to Flash unless the actions in NECESSARY
<command> = 0x12
<body> = <magic string>
<magic string> 0x37249266L—arbitrary...., 32 bit, high byte first
Responses: 0x06—General error response (bad magic number); 0x13—STORE settings response

| EXEMPLARY PROTOCOL COMMUNICATION INFORMATION |
| --- |
| (0x13) STORE settings response<br><command> = 0x13<br><body> = <empty><br>(0x14) Set Unit ID Request: Sets new Unit ID in gateway. Further transactions will use new ID.<br><command> = 0x14<br><body> = <magic number> <desired ID><br><magic string> 0x37249266L—arbitrary...., 32 bit, high byte first<br><desired id> Desired Unit ID, 16 bit, high byte first<br>Responses: 0x06—Bad parameter response; 0x15—Set Unit ID Response<br>(0x15) Set Channel Response<br><response> = 0x15<br><body> = <empty><br>(0x16) Get Unit ID Request<br><command> = 0x16<br><body> = <empty><br>Responses: 0x0d—Get Channel Response<br>(0x17) Get Unit ID Response<br><response> = 0x17<br><body> = <current channel><br><current ID> Unit ID, 16 bit, high byte first<br>B. Packet Level<br>(MMU to Gateway): <0x55> <0x55> <length> <Gateway ID> <command> <body> <checksum><br><0x55> literal header bytes<br><length> length—count of bytes starting with gateway ID, through checksum. Total length minus 4, 16 bits, high byte first<br><Gateway ID> Gateway address—test = 0x1235, 16 bits, high byte first<br><command> Command to execute, 16 bits, high byte first<br>(Gateway to MMU): <0xAA> <0xAA> <length> <Gateway ID> <command> <body> <checksum><br><0xAA> literal header bytes<br><length> length—count of bytes starting with gateway ID, through checksum. Total length minus 4, 16 bits, high byte first<br><Gateway ID> Gateway address—test = 0x1235, 16 bits, high byte first<br><command> Command response, 16 bits, high byte first |

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A solar module, comprising:
   a photovoltaic panel having an output;
   a local management unit connected to the photovoltaic panel to receive the output as input, the local management unit having:
      a communication module to receive a shut-down signal;
      a controller powered by the photovoltaic panel;
      a circuit path connected to the output of the photovoltaic panel, the circuit path comprising
         a switch controlled by the controller and
         a diode connected in series with the switch;
   wherein before the shut-down signal is received in the communication module, the switch is in an open state to prevent the output of the photovoltaic panel from going through the circuit path; and
   wherein after the shut-down signal is received in the communication module, the controller places the switch in a closed state; and
   wherein when the switch is in the closed state:
      the output of the photovoltaic panel goes through the circuit path including the diode, and
      the controller is powered by a voltage provided by the diode.

2. The solar module of claim 1, wherein the local management unit further comprises a second switch controlled by the controller and coupled between the output of the photovoltaic panel and an output of the local management unit; before the shut-down signal is received the second switch is in a closed state to provide a second circuit path for power generated by the photovoltaic panel to go from the output of the photovoltaic panel to the output of the local management unit; and after the shut-down signal is received in the communication module, the controller places the second switch in an open state to disconnect the second circuit path.

3. The solar module of claim 2, wherein the local management unit further comprises a third switch controlled by the controller and coupled between output terminals of the local management unit; after the shut-down signal is received in the communication module, the controller places the third switch in a closed state to provide a third circuit path that short circuits the output terminals; and before the shut-down signal is received the third switch is in an open state to disconnect the third circuit path.

4. The solar module of claim 1, wherein the local management unit further comprises a third switch controlled by the controller and coupled between output terminals of the local management unit; after the shut-down signal is received in the communication module, the controller places the third switch in a closed state to provide a third circuit path that short circuits the output terminals; and before the shut-down signal is received the third switch is in an open state to disconnect the third circuit path.

5. The solar module of claim 1, wherein the controller is configured to receive heartbeat signals from a central controller.

6. The solar module of claim 5, wherein the shut-down signal corresponds to time out of the heartbeat signals.

7. The solar module of claim 5, wherein the shut-down signal corresponds to a wireless signal transmitted from the central controller.

8. The solar module of claim 7, wherein the central controller includes a push-button which when pressed, causes the central controller to transmit the wireless signal.

9. The solar module of claim 7, wherein the central controller is controlled by a remote user device via a network connection to transmit the wireless signal.

10. A solar module, comprising:
a photovoltaic panel having an output;
a local management unit connected to the photovoltaic panel to receive the output as input, the local management unit having:
 a communication module to receive a shut-down signal;
 a controller;
 a first circuit path to provide power from the output of the photovoltaic panel to the controller before the shut-down signal is received in the communication module; and
 a second circuit path to provide power from the output of the photovoltaic panel to the controller after the shut-down signal is received in the communication module, wherein:
  the second circuit path includes a switch and a diode connected in series;
  the switch is controlled by the controller according to the shut-down signal to close the first circuit path; and
  when the switch is closed, a voltage across the diode powered by the output of the photovoltaic panel provides power to the controller.

11. The solar module of claim 10, wherein before the shut-down signal, the second circuit path is open; and after the shut-down signal, the second circuit path is closed.

12. The solar module of claim 10, wherein the first circuit path is coupled from the output of the photovoltaic panel to an output of the local management unit.

13. The solar module of claim 12, wherein the first circuit path includes a second switch controlled by the controller according to the shut-down signal to open the first circuit path.

14. A method implemented in a solar module, comprising:
receiving, as input in a local management unit connected to the photovoltaic panel, an
 output from the photovoltaic panel, the local management unit having:
 a communication module;
 a controller;
 a first circuit path; and
 a second circuit path having a switch and a diode connected in series;
providing, via the first circuit path, power from the output of the photovoltaic panel to the controller before a shut-down signal is received in the communication module;
receiving, in the communication module, the shut-down signal; and
providing, via the second circuit path, power from the output of the photovoltaic panel to the controller after the shut-down signal is received in the communication module, by controlling, by the controller, according to the shut-down signal to close the switch, wherein when the switch is closed, a voltage across the diode powered by the output of the photovoltaic panel provides power to the controller.

15. The method of claim 14, further comprising:
opening the switch before the shut-down signal is received in the communication module.

16. The method of claim 14, wherein the first circuit path is coupled from the output of the photovoltaic panel to an output of the local management unit.

17. The method of claim 16, further comprising:
controlling, by the controller, according to the shut-down signal to open the first path.

* * * * *